United States Patent [19]
Lee

[11] Patent Number: 5,987,313
[45] Date of Patent: Nov. 16, 1999

[54] APPARATUS FOR CONTROLLING TUNING POINT AND TUNING CIRCUIT HAVING FUNCTION OF CONTROLLING TUNING POINT

[75] Inventor: Sang-Cheal Lee, Seoul, Rep. of Korea

[73] Assignee: Daewoo Electronics Co., Ltd.

[21] Appl. No.: 08/866,110

[22] Filed: May 30, 1997

[30] Foreign Application Priority Data

Sep. 30, 1996 [KR] Rep. of Korea ..................... 96-43709

[51] Int. Cl.⁶ .................................................. H04B 1/18
[52] U.S. Cl. ................................. 455/186.1; 455/181.1; 455/184.1; 455/183; 364/157
[58] Field of Search ........................ 455/186.1, 186.2, 455/188.1, 188.2, 188.3, 188.4, 188.5, 180, 181, 182, 183, 184, 260, 264; 348/731, 734; 388/191, 193; 330/133, 280

[56] References Cited

U.S. PATENT DOCUMENTS

| | | | |
|---|---|---|---|
| 3,867,568 | 2/1975 | Merriweather | 178/5.8 AF |
| 5,023,938 | 6/1991 | Takegawa et al. | 455/183 |
| 5,430,891 | 7/1995 | Kianush et al. | 455/184.1 |
| 5,438,377 | 8/1995 | Chang | 348/731 |
| 5,450,621 | 9/1995 | Kianush et al. | 455/192.1 |
| 5,564,088 | 10/1996 | Saitoh | 455/186.1 |
| 5,581,529 | 12/1996 | Roth et al. | 369/84 |
| 5,784,691 | 7/1998 | Ruhl | 455/186.1 |

*Primary Examiner*—Wellington Chin
*Assistant Examiner*—Pablo N. Tran
*Attorney, Agent, or Firm*—Pillsbury Madison & Sutro LLP

[57] ABSTRACT

Disclosed is an apparatus for controlling a tuning point and a tuning circuit having a function of controlling a tuning point, which can selectively tuning each broadcasting signal by using a varactor diode. During a work for tuning points, a tuning voltage is applied to the tuning circuit, and a tuning point voltage with respect to the tuning voltage is stored in a memory section. If the tuning voltage is applied to the tuning circuit, a control section reads tuning point voltage data stored in the memory section, controls a voltage generating apparatus based on the read tuning point voltage data and provides the tuning point voltages for a relevant selected channel to the tuning circuit. Therefore, the work for tuning points in the manufacturing of a tuner can be omitted and the productivity and the function of the tuner are improved.

14 Claims, 12 Drawing Sheets

APPARATUS FOR CONTROLLING TUNING POINT AND TUNING CIRCUIT HAVING FUNCTION OF CONTROLLING TUNING POINT

BACKGROUND OF THE INVENTION

1. Field of the Invention

The present invention relates to an apparatus for controlling a tuning point by a tuning voltage which is applied to a tuning circuit and relates to a tuning circuit having a function of controlling a tuning point.

2. Description of the Prior Art

Generally, a tuner includes a tuning circuit, a mixer and an oscillator. The tuning circuit is tuned to a radio frequency signal of a bandwidth which is selected by a user among a plurality of broadcasting signals which are received via an antenna, and outputs the tuned radio frequency signal to the mixer. The oscillator generates a continuous wave which is equivalent to the radio frequency signal which is tuned by the tuning circuit. The mixer mixes the tuned radio frequency signal from the tuning circuit with the continuous wave signal from the oscillator, and outputs an intermediate frequency signal. Most of the tuning circuits have a function of varying a tuning frequency by using a varactor diode in order to be tuned to a specific bandwidth of the radio frequency signal. In the tuning circuit which includes the varactor diode, the tuning frequency is tuned by applying a tuning voltage which is equivalent to a specific frequency to the varactor diode. The tuning voltage which is applied to the tuning circuit is discretely distributed on the basis of assigned channels. Thus, in order to change the tuning frequency of the tuning circuit, i.e., the channel of the tuner, the tuning circuit can be tuned to each of the channel frequencies by discretely providing the tuning voltage to both terminals of the varactor diode of the tuning circuit.

FIG. 1 is a circuit diagram for showing the circuit configuration of a conventional tuning circuit for a tuner. As shown in FIG. 1, a tuning circuit 10 comprises a varactor diode VD1, an inductor L1 and a first capacitor C1. Varactor diode VD1 is connected in parallel to both inductor L1 and first capacitor C1 in order to configure a bandwidth filter. Varactor diode VD1 is connected to an external voltage source via a lead wire 102 so that a voltage is applied from the external voltage source to varactor diode VD1. When the voltage is applied to varactor diode VD1 via both terminals thereof, the applied voltage changes the capacitance of varactor diode VD1, thereby changing the tuning frequency of tuning circuit 10. Inductor L1 is connected in parallel to varactor diode VD1, and a third capacitor C3 is connected in series to inductor L1. Both second and third capacitors C2 and C3 are transmitting capacitors, and both fourth and fifth capacitors C4 and C5 are capacitors for removing an alternating current signal.

Therefore, working for tuning points is generally required in manufacturing tuners. The working for tuning points is performed by applying the tuning voltage which is equivalent to the specific broadcasting signal to a terminal 104 and by confirming whether or not tuning circuit 10 is accurately tuned to a relevant frequency signal according to the applied voltage. The work for tuning points is a process for confirming whether or not the tuning circuit is accurately tuned by a specific voltage which is applied to varactor diode VD1 of tuning circuit 10. When the tuning circuit has an error with respect to the applied voltage, a tuning frequency of the tuning circuit is adjusted by varying an inductance of inductor L1.

Therefore, the inductance of the inductor should be manually adjusted in manufacturing these tuning circuits and therefore, the productivity of the tuning circuits decreases by the number of the work for tuning points. Also, although the relevant tuning frequency is adjusted to coincide with the tuning voltage, the tuning point is still unstable because of the influence of an environment in practical use.

In U.S. Pat. No. 3,867,568 issued to Kenneth A. Merriweather on Feb. 18, 1975, an apparatus for controlling a tuning point for a tuning circuit is disclosed. A controlling circuit for an automatic frequency control system according to this patent comprises a synchronizing separating section for detecting a regenerative synchronizing pulse, a detecting section connected to the synchronizing separating section and for detecting the absence of the detected synchronizing pulse in a specific frequency transmitting bandwidth, and an automatic frequency control cut-off section for effectively disabling an automatic frequency control circuit for varying the tuning frequency in accordance with the absence of the detected synchronizing pulse. According to the description in the U.S. patent, an inductor should be manually adjusted in manufacturing the tuning circuits and thereby the productivity of the tuning circuit decreases by the number of the work for tuning points. Also, although the relevant tuning frequency of the tuning circuit is adjusted to coincide with the channel voltage, the relevant tuning point is still unstable because of the influence of the environment in practical use.

SUMMARY OF THE INVENTION

Accordingly, it is an object of the present invention considering the above-mentioned condition, to provide an apparatus for controlling a tuning point which can adjust the tuning point of a tuning circuit without adjusting the inductance of the inductor of the tuning circuit during a work for tuning points.

Another object of the present invention is to provide a tuning circuit having a controlling function of a tuning point which can adjust the tuning point of the tuning circuit without adjusting the inductance of the inductor of the tuning circuit during a work for tuning points.

A further object of the present invention is to provide an apparatus for controlling a tuning point which can provide the tuning point to a tuning circuit irrespective of the influence of an environment.

Another further object of the present invention is to provide a tuning circuit having an apparatus for controlling a tuning point which can provide the tuning point to a tuning circuit irrespective of the influence of an environment.

According to one aspect of the present invention, there is provided an apparatus for controlling a tuning point comprising:

a memory means for storing tuning voltage data provided from a tuning section which outputs a broadcasting signal which is equivalent to an applied tuning voltage, and for storing tuning point voltage data of the tuning voltage data;

a means for generating a voltage which is equivalent to an inputted control signal and for providing the generated voltage to the tuning section;

a signal input means for generating a storing instruction signal for storing the tuning voltage data and the tuning point voltage data in the memory means; and a control means for receiving and storing tuning voltages and tuning point voltages from the tuning section in the memory means by an operation of the signal input means, and for providing a control signal to the means for generating a voltage so that the voltage generating means provides point voltages for a relevant selected channel based on the tuning point voltage data stored in the memory means during an application of the tuning voltage.

According to another aspect of the present invention, there is provided a tuning circuit having an apparatus for controlling a tuning point. The apparatus includes a tuning section for outputting a broadcasting signal which is equivalent to an applied tuning voltage and the above described tuning point controlling apparatus.

According to still another aspect of the present invention, there is provided a tuning circuit having a function for controlling a tuning point comprising:

a tuning section for outputting a broadcasting signal which is equivalent to an applied tuning voltage;

a means for detecting a voltage for detecting a voltage of the broadcasting signal from the tuning section and outputting a voltage detection signal; and a means for generating a feedback voltage for controlling a tuning point voltage applied to the tuning section according to the voltage detection signal from the means for detecting a voltage.

According to still another aspect of the present invention, there is provide an apparatus for controlling a tuning point comprising:

a means for controlling a tuning point for detecting a voltage of a broadcasting signal from a tuning section which outputs the broadcasting signal which is equivalent to a tuning voltage in order to control a tuning point voltage and compensate the tuning voltage according to a level change of a voltage of the detected broadcasting signal;

a memory means for storing tuning voltage data and tuning point voltage data of the tuning voltage data;

a means for generating a voltage which is equivalent to an inputted control signal and providing the generated voltage to the tuning section;

a signal input means for generating a storing instruction signal for storing the tuning voltage data and the tuning point voltage data in the memory means; and a control means for receiving and storing tuning voltages and tuning point voltages from the tuning section in the memory means by an operation of the signal input means, and for providing a control signal to the means for generating a voltage so that the voltage generating means point voltages for a relevant selected channel based on the tuning point voltage data stored in the memory means during an application of the tuning voltage.

According to the present invention, the tuning voltage is applied to the tuning circuit, and the tuning point voltage with respect to the applied tuning voltage is stored in the memory means during the work for tuning points. When the tuning voltage is applied to the tuning circuit, the control means reads the tuning point voltage data stored in the memory means and controls the means for generating a voltage based on the read tuning point voltage data to provide the tuning point voltage for a relevant selected channel to the tuning circuit. When the tuning point voltage is applied from the means for generating a voltage, the tuning circuit accurately receives the broadcasting frequency. However, since the impedance value of the tuning circuit changes according to changes in the temperature of an environment, the tuning point voltage of the tuning circuit also changes. At this time, the means for detecting a voltage detects the voltage of the broadcasting signal received by the tuning circuit and provides the detected voltage to the means for generating a feedback voltage. Then, the means for generating a feedback voltage controls the tuning point voltage applied to the tuning circuit according to the voltage detection signal from the means for detecting a voltage and compensates the tuning point voltage applied to the tuning circuit from the means for generating a voltage.

Accordingly, the working for tuning points can be omitted during the manufacturing of the tuner, so productivity can be improved. In addition, the function of the tuner is largely improved.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Hereinafter, the preferred embodiments of the present invention will be explained in more detail with reference to the accompanying drawings.

Figure 1:
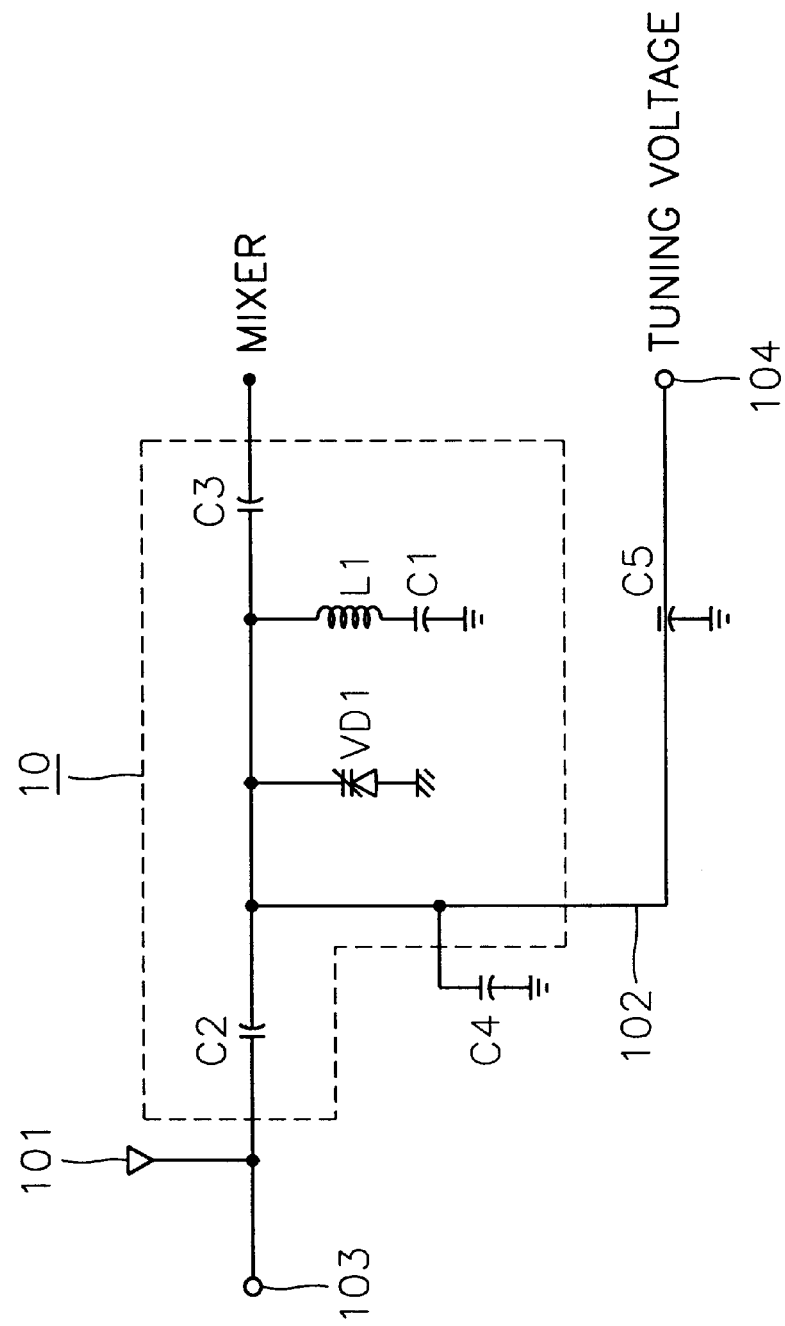
FIG. 1 is a circuit diagram for showing the circuit configuration of a conventional tuning circuit for a tuner.
Figure 2:
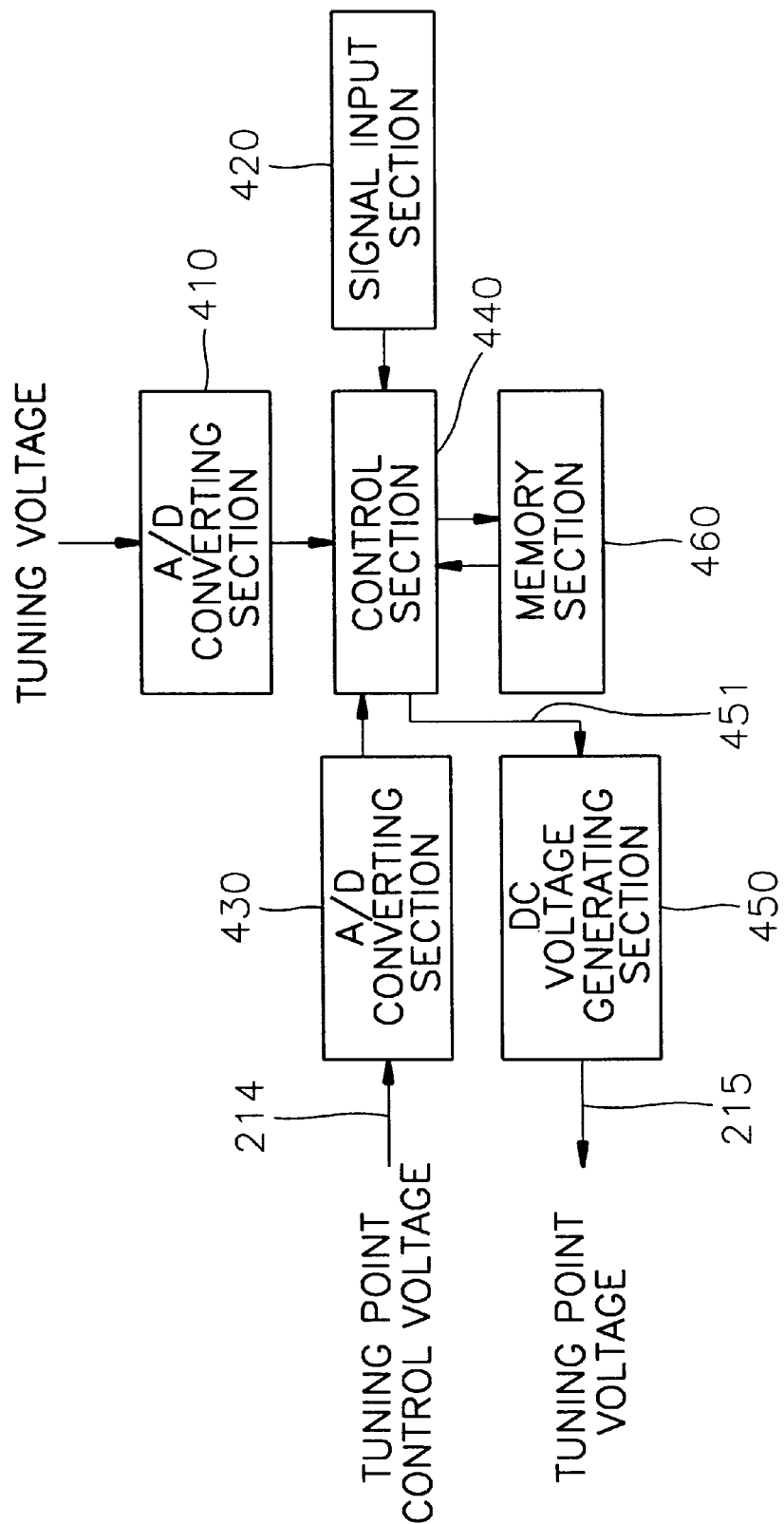
FIG. 2 illustrates the configuration of an apparatus for controlling a tuning point according to a first embodiment of the present invention.

FIG. 2 illustrates the configuration of an apparatus for controlling a tuning point according to a first embodiment of the present invention.

In FIG. 2, the apparatus for controlling a tuning point 400 has a memory section 460, a direct current voltage generating section 450, a signal input section 420, a first analog/digital converting section 410, a second analog/digital converting section 430 and a control section 440.

Memory section 460 stores tuning voltage data provided from a tuning circuit (not shown) which outputs broadcasting signals which are equivalent to applied tuning voltages, and stores the tuning point voltage data of the tuning circuit according to the tuning voltage data under the control of control section 440.

Direct current voltage generating section 450 generates a tuning point voltage according to a control signal inputted from control section 440. First analog/digital converting section 410 converts the applied tuning voltage into a digital signal and provides this digital signal to control section 440.

Signal input section 420 provides a memory instruction signal to control section 440 so that the tuning voltage data and the tuning point voltage data are stored in memory section 460.

Second analog/digital converting section 430 converts a tuning point control voltage applied to the tuning circuit (not shown) into a digital signal and provides this digital signal to control section 440.

Control section 440 operates by the operation of signal input section 420 and stores a tuning voltage applied from first analog/digital converting section 410 and the tuning point control voltage applied from second analog/digital converting section 430 in memory section 460 as the tuning point voltage. In addition, control section 440 provides a control signal 451 to voltage generating section 450 so that voltage generating section 450 provides the point voltage for the relevant selected channel based on the tuning point voltage data stored in memory section 460 during the application of the tuning voltage.

According to the above-mentioned constitution, a user applies the tuning voltage to the tuning circuit for detecting the tuning point voltage which is equivalent to the tuning voltage of the tuning circuit during the manufacturing of the tuning circuit and applies the tuning point control voltage to the tuning circuit, to which the tuning voltage is applied, to detect the tuning point voltage of the tuning circuit. At this time, the tuning voltage and the tuning point control voltage applied to the tuning circuit are converted into the respective digital signals, by first and second analog/digital converting sections 410 and 430 and are provided to control section 440. When the present tuning point control voltage is the tuning point voltage, the user informs control section 440 via signal input section 420 that the present tuning point control voltage is the tuning point voltage. Then, control section 440 stores the tuning point control voltage signal which is inputted from second analog/digital converting section 430 as the tuning voltage and is in correspondence with the tuning voltage, in memory section 460. According to the above-mentioned process, the work for tuning points is completed by storing the tuning point voltage for each tuning voltage in memory section 460.

Thereafter, when the apparatus for controlling the tuning point is installed in the tuning circuit when the tuning point voltage data are stored in memory section 460, control section 440 reads the tuning point voltage data which are equivalent to the tuning voltage from memory section 460, controls direct current voltage generating section 450 based on the read tuning point voltage data and provides the tuning point voltage to the tuning circuit.

Therefore, the process of the tuning point of the tuning circuit according to the tuning voltage can be omitted during the manufacturing of the tuning circuit.

Figure 3:
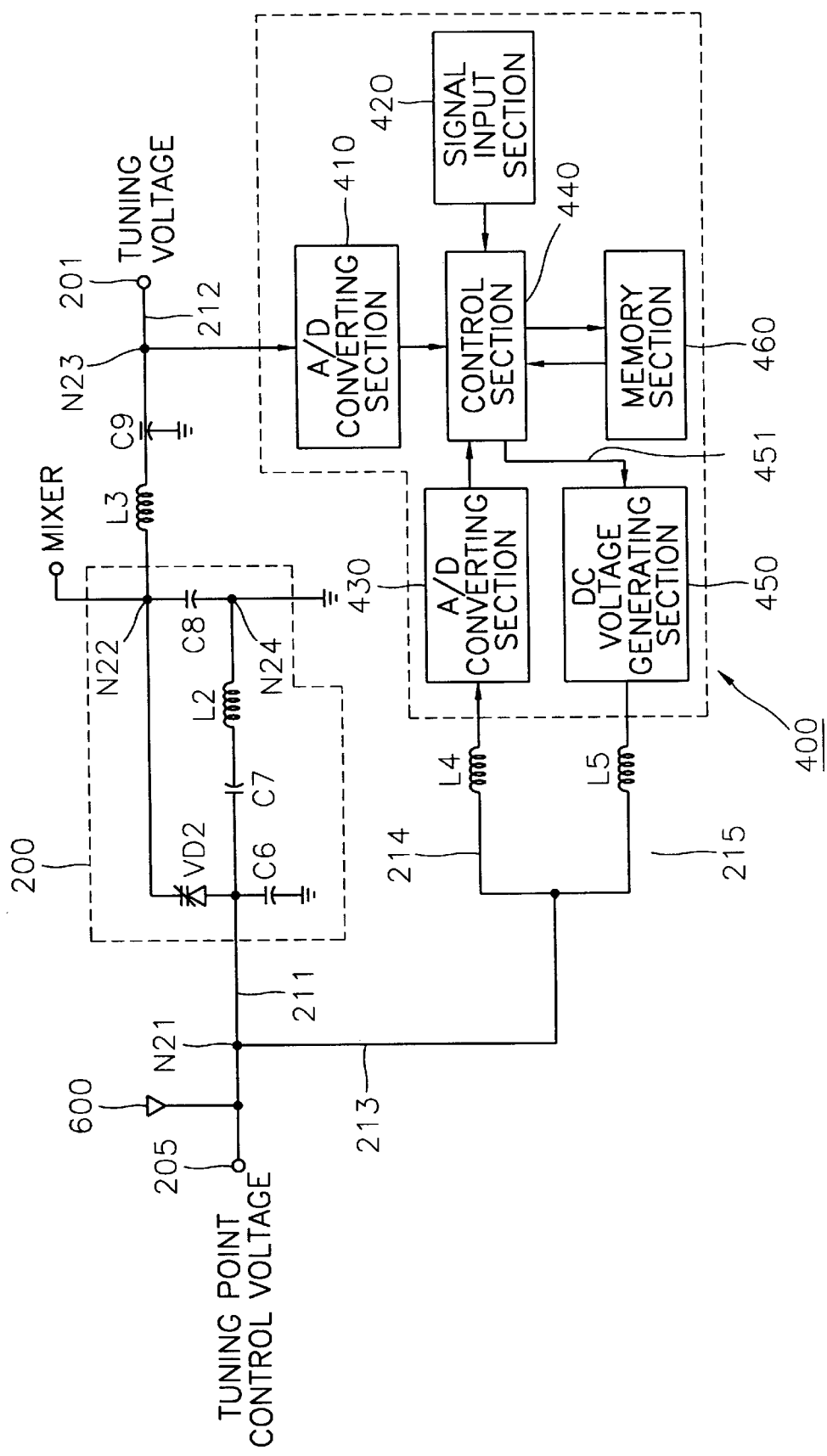
FIG. 3 illustrates a circuit having the function of controlling a tuning point according to a second embodiment of the present invention.

FIG. 3 illustrates a circuit diagram having the function of controlling a tuning point according to a second embodiment of the present invention.

In FIG. 3, the same reference numerals are used for the same components is illustrated in FIG. 2.

The tuning circuit having the function of controlling the tuning point includes a tuning section 200 and apparatus for controlling the tuning point 400.

Apparatus for controlling the tuning point 400 includes memory section 460, direct current voltage generating section 450, signal input section 420, first analog/digital converting section 410, second analog/digital converting section 430 and control section 440.

In memory section 460, the tuning voltage data provided from tuning section 200, which outputs a frequency signal which is equivalent to the applied tuning voltage, and the tuning point voltage data of the tuning voltage data under the control of control section 440 are stored. Direct current voltage generating section 450 generates the tuning point control voltage according to the control signal inputted from control section 440 and provides the generated voltage to tuning section 200. First analog/digital converting section 410 converts the applied tuning voltage into the digital signal and provides this digital signal to control section 440. Signal input section 420 provides the memory instruction signal to control section 440 so that the tuning voltage data and the tuning point voltage data are stored in memory section 460. Second analog/digital converting section 430 converts the tuning point control voltage applied to tuning section 200 into the digital signal and provides this digital signal to control section 440. Control section 440 operates by the operation of signal input section 420 and stores the tuning voltage applied from first analog/digital converting section 410 and the tuning point control voltage applied from second analog/digital converting section 430 as the tuning point voltage data in memory section 460. In addition, control section 440 provides control signal 451 to direct current voltage generating section 450 so that direct current voltage generating section 450 provides the tuning point voltages for the relevant selected channel based on the tuning point voltage data stored in memory section 460 during the application of the tuning voltage.

One terminal of tuning section 200 is connected to an antenna 600, direct current voltage generating section 450 and first analog/digital converting section 410 via a first node N21 of a first lead wire 211, and the tuning point control voltage is applied to tuning section 200 via a fifth terminal 205 of first lead wire 211. Further, the other terminal of tuning section 200 is connected with first analog/digital converting section 410 via a third node N23 of a second lead wire 212, and the tuning voltage is applied via first terminal 201 of second lead wire 212. In addition, tuning section 200 is connected with a mixer (not shown) via a second node N22. At second lead wire 212, a third inductor L3 is connected in series with tuning section 200. Third inductor L3 prevents an output of an alternating current component generated from tuning section 200 to first terminal 201. In FIG. 3, a ninth capacitor C9 represents a parasitic capacitor of second lead wire 212.

First analog/digital converting section 410 is connected to third node N23. First analog/digital converting section 410 converts the voltage of first terminal 201 into a predetermined digital signal and transmits this digital signal to control section 440.

In memory section 460, the tuning voltage data provided by tuning section 200 and the tuning point voltage data according to the tuning voltage data are stored. Direct current voltage generating section 450 generates the voltage corresponding to control signal 451 inputted from control section 440 and provides the generated voltage to a third lead wire 213 of tuning section 200 via a second switch S2. Signal input section 420 provides the memory instruction signal to control section 440 so that the tuning voltage data and the tuning point voltage data are stored in memory section 460. First analog/digital converting section 410 converts the tuning voltage applied via third node N23 into a predetermined digital signal and outputs this digital signal. Second analog/digital converting section 430 receives the voltage of the other terminal of a varactor diode VD2 of tuning section 200 via fourth lead wire 214 and second switch S2 and outputs a predetermined digital signal. Control section 440 operates by the operation of signal input section 420 and stores the tuning voltage applied from first analog/digital converting section 410 and the tuning point voltage applied to second analog/digital converting section 430 in memory section 460. In addition, control section 440 provides control signal 451 to voltage generating section 450 so that voltage generating section 450 provides the point voltages for the relevant selected channel based on the tuning point voltage data stored in memory section 460 during the application of the tuning voltage.

In FIG. 3, the work for controlling the tuning point of the tuning circuit is carried out as follows. First, a user respectively inputs the tuner voltages for tuning channels to first terminal 201 and confirms the tuning condition by confirming whether or not the frequency signal of the selected channel according to the tuning voltage for tuning channel coincides with the tuning frequency of tuning section 200 by means of an instrumenting machine (not shown) installed on fifth terminal 205, e.g. oscilloscope (not shown). If tuning circuit 200 is not exactly at the tuning point, the voltage of varactor diode VD2 is controlled by applying the tuning point control voltage via fifth terminal 205. At this time, if tuning section 200 exactly receives the corresponding broadcasting channel signal, the accurate adjustment of the tuning point to control section 440 is transmitted via signal input section 420. Then, control section 440 reads the tuning voltage and the tuning point control voltage, respectively from first analog/digital converting section 410 and second analog/digital converting section 430, and stores the relevant channel voltage and the tuning point control voltage in memory section 460. In the same manner, the work for tuning points to the channel is completed through the work for tuning points to each channel voltage during the manufacturing of the tuner.

Thereafter, the tuning of tuning section 200 will be explained. If the tuning voltage is applied to tuning section 200 for tuning channels, the tuning voltage is applied to varactor diode VD2 and is simultaneously provided to first analog/digital converting section 410. When the tuning voltage is applied to first analog/digital converting section 410, first analog/digital converting section 410 outputs the corresponding digital signal to control section 440. If the tuning voltage is applied, control section 440 reads the tuning point voltage data which are equivalent to the tuning voltage from memory section 460, and controls direct current voltage generating section 450 based on the read tuning point control voltage data to output a tuning point voltage 215. If the tuning point voltage is generated from direct current voltage generating section 450, the difference voltage of the tuning voltage and the tuning point voltage is applied to varactor diode VD2 of tuning section 200 and this difference voltage enables the accurate tuning of tuning section 200 to the frequency signal of the selected broadcasting channel.

Figure 4:
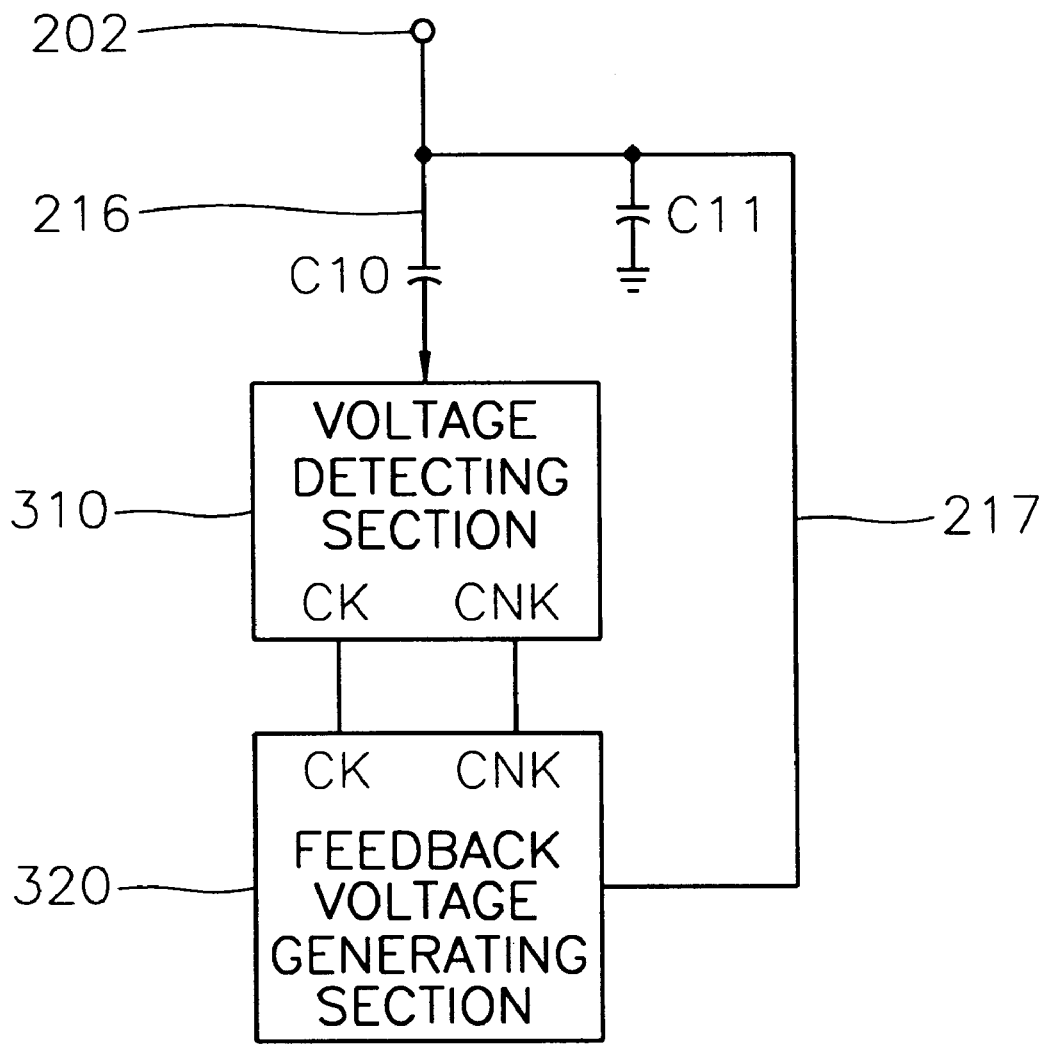
FIG. 4 illustrates the configuration of an apparatus for controlling a tuning point according to a third embodiment of the present invention.

FIG. 4 illustrates an apparatus for controlling a tuning point according to a third embodiment of the present invention.

In FIG. 4, the apparatus for controlling the tuning point according to the third embodiment of the present invention has a voltage detecting section 310 and a feedback voltage generating section 320.

Voltage detecting section 310 detects the voltage of the broadcasting signal from the tuning circuit (not shown) inputted via a second terminal 202 in order to control the tuning point voltage.

Feedback voltage generating section 320 compensates the tuning voltage according to the change of the voltage level of the broadcasting signal detected from voltage detecting section 310. In addition, feedback voltage generating section 320 is connected with voltage detecting section 310 via first and second input terminals CK and CNK.

Figure 5:
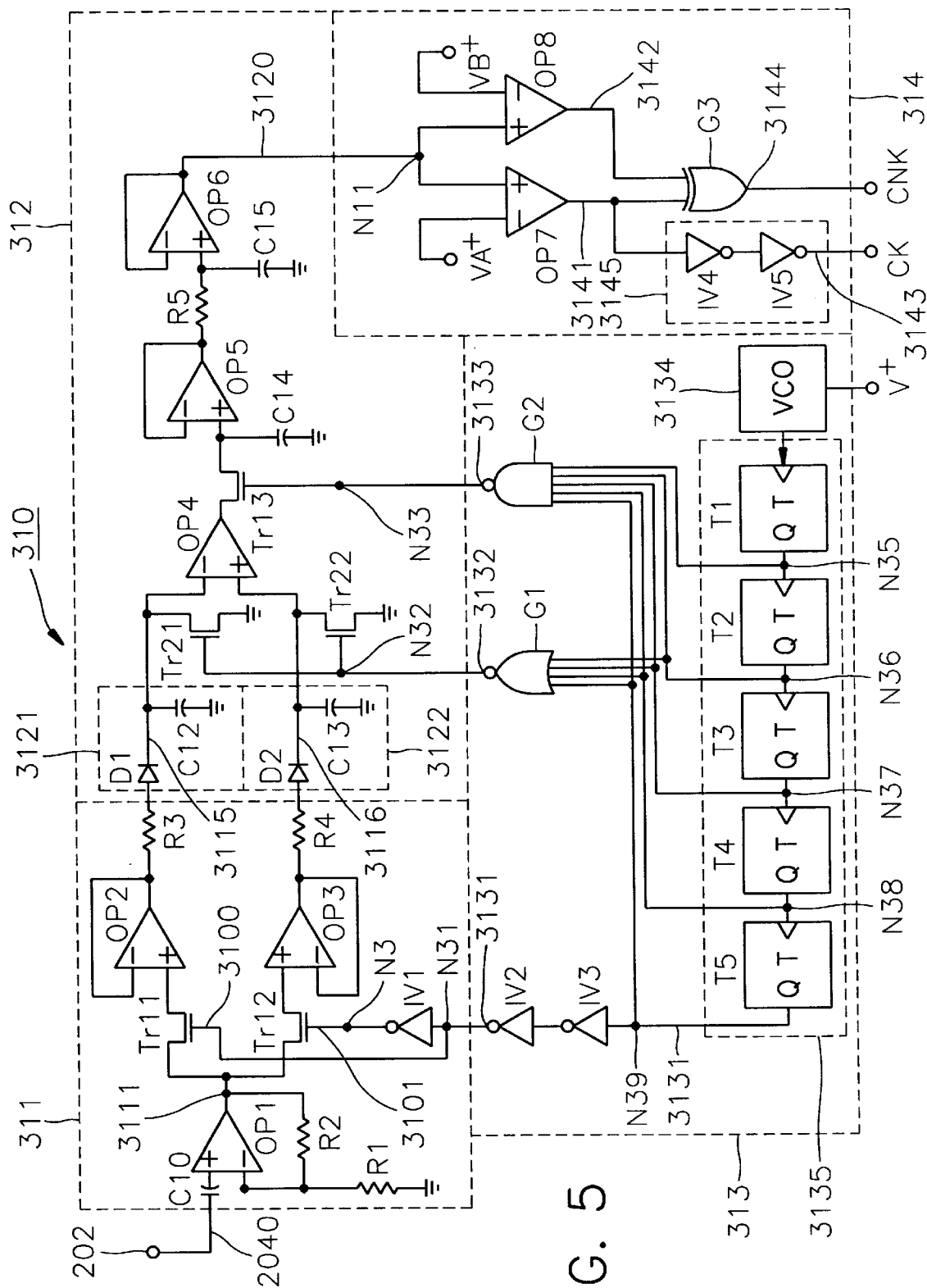
FIG. 5 is a circuit diagram for showing an example of a voltage detecting section illustrated in FIG. 4.

FIG. 5 is a detailed circuit diagram for showing voltage detecting section 310 illustrated in FIG. 4. Voltage detecting section 310 detects the voltage of the tuned signal by the tuning circuit (not shown) via a tenth capacitor C10 and a first switch S1, treats the detected signal and outputs the result to first and second input terminals CK and CNK of feedback voltage generating section 320.

Voltage detecting section 310 comprises an input section 311 for successively sampling the broadcasting signals received by tuning section 200 and outputting the sampled signals, a comparing section 312 for comparing the successive signals sampled from input section 311 and outputting the data of the compared result, a signal generation section 313 for providing a first control signal 3131 for determining the sampling time by input section 311 to input section 311, and providing second and third control signals 3132 and 3133 for comparing section 312 and respectively determining the output time to comparing section 312 and a discriminating section 314 for discriminating the data of the compared result 3120 from comparing section 312 and outputting the discriminated signal.

Input section 311 includes an amplifier OP1 for amplifying an inputted signal from tuning section 311 and outputting an amplified signal 3111, a first transmitting transistor Tr11 connected to the output terminal of amplifier OP1 for outputting amplified signal 3111 from amplifier OP1 after being selectively turned-on according to the signal level of signal generation section 313, which is inputted to the gate of amplifier OP1, and a second transmitting transistor Tr12 connected to the output terminal of amplifier OP1 for outputting amplified signal 3111 from amplifier OP1 at the time of turning-on through a complementary operation with first transmitting transistor Tr11.

The output terminal of first transmitting transistor Tr11 is connected with a first unity-gain buffer OP2 and the output terminal of second transmitting transistor Tr12 is connected with a second unity-gain buffer OP3. The output terminal of first unity-gain buffer OP2 is connected with the input terminal of comparing section 312 via a third resistor R3. The output terminal of second unity-gain buffer OP3 is connected to another input terminal of comparing section 312 via a fourth resistor R4. At amplifier OP1, a first resistor R1 and a second resistor R2 are connected in parallel with an inversion terminal of amplifier OP1 for amplifying a frequency signal 2040 inputted via second terminal 204 by a constant ratio. The gate electrodes of first and second transmitting transistors Tr11 and Tr12 are connected with a first output node N31, which is a common node for the output terminal of signal generation section 313, and a first inverter IV1 is provided between the gate electrode of second transistor Tr12 and first output node N31 to enable a complementary operation of first and second transistors Tr11 and Tr12.

Amplifier OP1 of input section 311 non-inversely amplifies a broadcasting signal 3110 inputted via input terminal 204 at a ratio of R2/R1, and outputs the non-inversely amplified broadcasting signal 3111 at a ratio of R2/R1 via two of first and second transmitting transistors Tr11 and Tr12. First and second transmitting transistors Tr11 and Tr12 receive broadcasting signal 3111 non-reversely amplified by amplifier OP1 at the ratio of R2/R1 and output an amplified broadcasting signal according to respective gate input signals 3100 and 3101. Gate signal 3100 of first transmitting transistor Tr11 is a signal obtained by twice inverting output signal 3131 of a fifth T flip-flop T5 of signal generation section 313 via second and third inverters IV2 and IV3, which are connected in series, and gate signal 3101 of second transmitting transistor Tr12 is a signal obtained by inverting gate signal 3100 of first transmitting transistor Tr11 once more. Accordingly, first transmitting transistor Tr11 and second transmitting transistor Tr12 operate complimentarily to each other, and as the result, the signals continuously outputted from amplifier OP1 are successively sampled by the complementarity of first transmitting transistor Tr11 and second transmitting transistor Tr12.

Comparing section 312 is connected in parallel with first and second diodes D1 and D2, which are connected in series with the third resistor and the fourth resistor, respectively, for rectifying the successively sampled signals by input section 311, and includes first and second rectifying circuits 3121 and 3122 consisting of twelfth and thirteenth capacitors C12 and C13, whose terminal portions are earthed. First and second bypass transistors Tr21 and Tr22 are connected to first and second diodes D1 and D2 in parallel relation with twelfth and thirteenth capacitors C12 and C13 of first and second rectifying circuits 3121 and 3122. To the gate electrodes of first and second bypass transistors Tr21 and Tr22, second output signal 3132 of signal generation section 313 is inputted, and the source electrodes of first and second bypass transistors Tr21 and Tr22 are earthed for discharging the charged charge of twelfth and thirteenth capacitors C12 and C13 of first and second rectifying circuits 3121 and 3122 according to the voltage level of second output signal 3132. A first comparator OP4 for comparing the first charging voltage and the second charging voltage of twelfth capacitor C12 and thirteenth capacitor C13 and for outputting the compared result, is connected to the drain electrode portions of first and second bypass transistors Tr21 and Tr22.

Further, to the output terminal of first comparator OP4, a third transmitting transistor Tr13 is connected, and third transmitting transistor Tr13 is selectively turned-on according to the level of the third output signal of signal generation section 313 and outputs the compared result from first comparator OP4. To the output terminal of third transmitting transistor Tr13, third and fourth unity-gain buffers OP5 and OP6 are successively connected. Between third transmitting transistor Tr13 and third unity-gain buffer OP5, a fourteenth capacitor C14 is connected in parallel to third unity-gain buffer OP5, and one terminal of fourteenth capacitor C14 is earthed. In addition, between third and fourth unity-gain buffers OP5 and OP6, a fifth resistor R5 is provided. Fifteenth capacitor C15 is connected in parallel to fourth unity-gain buffer OP6 and is in parallel relation with fifth resistor R5, and one terminal of fifteenth capacitor C15 is earthed.

Half-wave rectified broadcasting signal is inputted to first comparator OP4, and the compared result is transmitted to third and fourth unity-gain buffers OP5 and OP6 via third transmitting transistor Tr13 and is amplified. The gates of first bypass transistor Tr21 and second bypass transistor Tr22 are commonly connected to a second output node N32 and discharge the charged charge of fifteenth and sixteenth capacitors C15 and C16 according to the voltage level of second output node N32. Third transmitting transistor Tr13 outputs the result of first comparator OP4 according to the voltage level of a third output node N33.

Signal generating section 313 includes a voltage control oscillator 3134 for generating a signal having a predetermined frequency and a frequency demultiplier 3135 for demultiplying the frequency of the generated signal from voltage control oscillator 3134 to generate the first, the second and the third control signals. Frequency demultiplier 3135 includes first, second, third, fourth and fifth T flip-flops T1, T2, T3, T4 and T5, to which the input terminal and the output terminal of frequency demultiplier 3135 are dependently connected.

A ninth node N39 of fifth T flip-flop T5 is connected to first output terminal 3131 via second and third inverters IV2 and IV3, and first output terminal 3131 is connected to first output node N31. Sixth, seventh, eighth and ninth nodes N36, N37, N38 and N39 of second to fifth T flip-flops T2, T3, T4 and T5 are connected to four input terminals of a NOR gate G1. In addition, sixth to ninth nodes N35 to N38 of second to fifth T flip-flops T2, T3, T4 and T5 and a fifth node N35 of first T flip-flop are connected to five input terminals of a NAND gate G2. Second output terminal 3132 of NOR gate G1 is connected to second output node N9, and third output terminal 3133 of NAND gate G2 is connected to third output node N33.

Discriminating section 314 includes a second comparator OP7 and a third comparator OP8. Second comparator OP7 compares the voltage which is equivalent to the compared result from comparing section 312 with a first standard voltage $V_A$, outputs a first comparison signal 3141 which is equivalent to the compared result to one input terminal 3143 of a first exclusive (XOR) gate G3, and outputs a first discrimination signal 3143 to first input terminal CK of feedback voltage generating section 320 via a buffer 3145 consisting of fourth and fifth inverters IV4 and IV5.

A third comparator OP8 compares the voltage which is equivalent to the compared result from comparing section 312 with a second standard voltage $V_B$, and outputs a third comparison signal 3142 which is equivalent to the compared result to another one input terminal 3144 of third XOR gate G3. First XOR gate G3 outputs a second discrimination signal 3144, which is outputted by the logical operation of the second comparison signal from second comparator OP7, with the third comparison signal from third comparator OP8 to second input terminal CNK.

Figure 6:
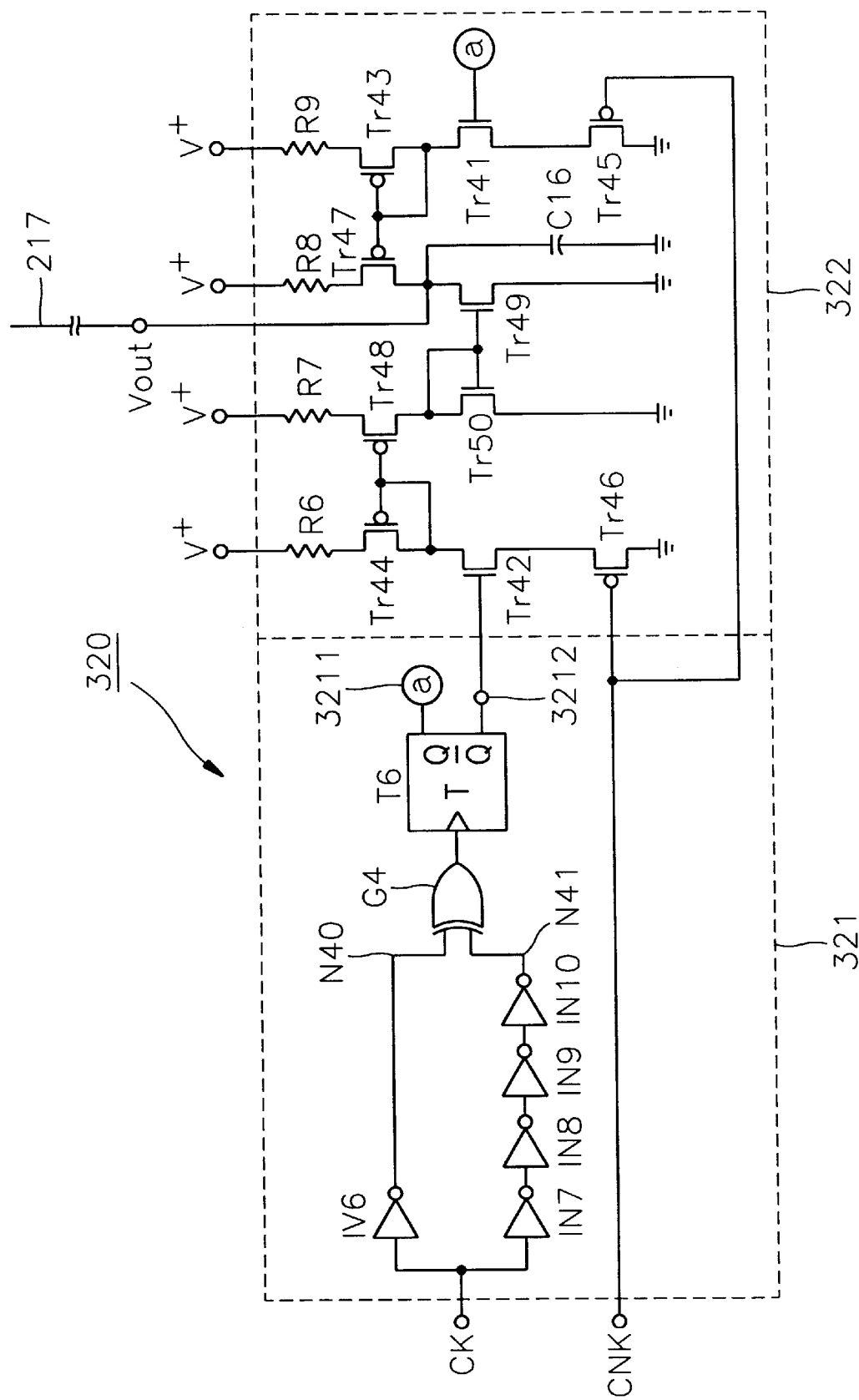
FIG. 6 is a circuit diagram for showing an example of a voltage compensating section illustrated in FIG. 4.

FIG. 6 is a detailed circuit diagram for showing feedback voltage generating section 320 illustrated in FIG. 4. In FIG. 6, feedback voltage generating section 320 includes a driving section 321 and a voltage compensating section 322. Driving section 321 is connected with first input terminal CK and is provided with a sixth inverter IV6 which inverts first discrimination signal inputted from first input terminal CK. In addition, first input terminal CK is connected with a seventh inverter IV7 of driving section 321, and seventh inverter IV7 is connected continuously and in series with eighth, ninth and tenth inverters IV8, IV9 and IV10 for delaying and outputting first discrimination signal inputted from first input terminal CK. Two outputting signals of sixth inverter IV6 and tenth inverter IV10 are inputted to a second XOR gate G4 and the output of first XOR gate G3 is inputted to a sixth T flip-flop T6. One output terminal of sixth T flip-flop is connected with third input terminal 3211 and the other output terminal is connected with a fourth input terminal 3212.

A third input terminal 3211 of driving section 321 is connected with the gate electrode of a first transistor Tr41 of voltage compensating section 322, and fourth input terminal 3212 is connected with the gate electrode of a second transistor Tr42. The drain electrode of first transistor Tr41 is connected with the source and the gate electrodes of a third transistor Tr43 which complementarily operates with first transistor Tr42. The drain electrode of second transistor Tr42 is connected with the source and the gate electrodes of a fourth transistor Tr44 which complementarily operates with second transistor Tr42.

Further, the source electrode of first transistor Tr41 is connected with the drain electrode of a fifth transistor Tr45 which complementarily operates with first transistor Tr41. The source electrode of second transistor Tr42 is connected with the drain electrode of a sixth transistor Tr46. The source electrode of fifth transistor Tr45 and the source electrode of sixth transistor Tr46 are earthed, and the gate electrode of fifth transistor Tr45 and the gate electrode of sixth transistor Tr46 are connected with second input terminal CNK.

The gate electrode of third transistor Tr43 is connected with the gate electrode of a seventh transistor Tr47 which complementarily operates with first transistor Tr41, and the gate electrode of fourth transistor Tr44 is connected with the gate electrode of an eighth transistor Tr48 which complementarily operates with second transistor Tr42.

The source electrode of seventh transistor Tr47 is connected with the drain electrode of a ninth transistor Tr49 which complementarily operates with seventh transistor Tr47, and the source electrode of eighth transistor Tr48 is connected with the drain and the gate electrodes of a tenth transistor Tr50 which complementarily operates with eighth transistor Tr48.

The gate electrode of ninth transistor Tr49 is connected with the gate electrode of tenth transistor Tr50, and is connected with a contact between the drain electrode of tenth transistor Tr50 and the source of eighth transistor Tr48. The source electrode of ninth transistor Tr49 and the source electrode of tenth transistor Tr10 are earthed.

In addition, the drains of third, fourth, seventh and eighth transistors Tr43, Tr44, Tr47 and Tr48 are connected with an external electrode V$^+$ via sixth, seventh, eighth and ninth resistors R6, R7, R8 and R9, respectively. In addition, between the contact of the drain of ninth transistor Tr49 and seventh transistor Tr47, and the earth, sixteenth capacitor C16 for charging is connected. To the contact of the drain of ninth transistor Tr49 and seventh transistor Tr47, a voltage output terminal $V_{OUT}$ of sixteenth capacitor C16 is connected and the charging voltage is externally outputted via a seventh lead wire 217 which is connected with voltage output terminal $V_{OUT}$.

The operation of the apparatus for controlling the tuning point constituted as in FIG. 4 according to the third embodiment of the present invention will be described below while referring to FIGS. 7A to 8F.

Figure 7A:
FIGS. 7A to 7I are operating waveform diagrams for explaining the operation of a voltage detecting section illustrated in FIG. 5.
Figure 7B:
Figure 7C:
Figure 7D:
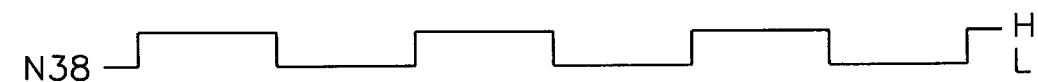
Figure 7E:
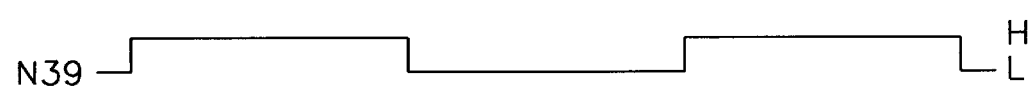
Figure 7F:
Figure 7G:
Figure 7H:
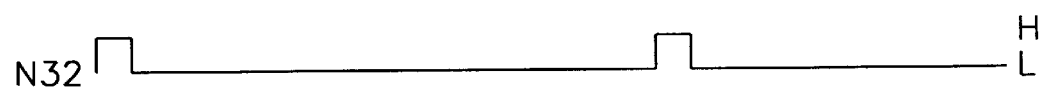
Figure 7I:

FIGS. 7A to 7I are operating waveform diagrams for explaining the operation of voltage detecting section 310 illustrated in FIG. 5. In FIGS. 7A to 7E, the output waveform diagrams of output terminal nodes N35–N39 of first to fifth T flip-flops T1–T5 are quantitatively illustrated. Signal generation section 313 is externally outputted via first output node N31, second output node N32 and third output node N33. The output waveforms of first output node N31, second output node N32 and third output node N33 are illustrated in FIGS. 7G to 7I. In FIGS. 7G to 7I, the output having a high level for the longest time is the output of third output node N33. The output of first output node N31 has a high level for the second longest time. This relation concerning the time will be explained in detail below.

Discriminating section 314 includes second and third comparators OP7 and OP8 having different first standard voltage $V_A$ and second standard voltage $V_B$ for discriminating the inputted signal from comparing section 312, and includes XOR gate G3 for the logical operation of the first and second compared results 3141 and 3142 of second and third comparators OP7 and OP8.

First transmitting transistor Tr11 of input section 311 in FIG. 5, is turned-on when first output node N31 of signal generation section 313 is at a high level as illustrated in FIG. 7E and transmits broadcasting signal 3111 outputted to first amplifier OP1 to first unity-gain buffer OP2. At this time, since second transmitting transistor Tr12 is in the state of "off", the transmission of broadcasting signal 3111 to second unity-gain buffer OP3 is cut-off. When the voltage of first output node N31 becomes low level, first transmitting transistor Tr11 is off, and second transmitting transistor Tr12 is on. Also, the next broadcasting signal is transmitted only to second unity-gain buffer OP3. Accordingly, input section 311 successively samples continuously inputted broadcasting signals by ½ period of the waveform of FIG. 5F.

First and second broadcasting signals 3113 and 3114 transmitted from first unity-gain buffer OP2 and second unity-gain buffer OP3 of input section 311 are half-waves respectively rectified by first and second diodes D1 and D2, and the rectified first and second signals 3115 and 3116 charges fifteenth and sixteenth capacitors C15 and C16 again. During the charging of fifteenth and sixteenth capacitors C15 and C16, third and fourth bypass transistors Tr21 and Tr22 are turned-on as in FIG. 7H. Therefore, all the charges charged in fifteenth and sixteenth capacitors C15 and C16 should be discharged before the charging. The charging voltages of fifteenth and sixteenth capacitors C15 and C16 are applied to first comparator OP4 and are compared with each other. The compared result is outputted to third unity-gain buffer OP5 via third transmitting transistor Tr13. Third transmitting transistor Tr13 is controlled by the voltage of third output node N33 of signal generation section 313, and the output waveform of third output node N33 is illustrated in FIG. 7I. Accordingly, third transmitting transistor Tr13 is turned-off as soon as first and second bypass transistors Tr21 and Tr22 are turned-off, and prevents the output of the logical operation result of first comparator OP4 during the charging of fifteenth and sixteenth capacitors C15 and C16.

Meanwhile, when the compared result 3120 of comparing section 312 is inputted to discriminating section 314 and when standard voltage $V_A$ of second comparator OP7 is larger than standard voltage $V_B$ of third comparator OP8 by a predetermined value ($V_A > V_B$), the output of discriminating section 314 with respect to an output voltage $V_{N11}$ of comparing section 312 is illustrated in Table 1.

TABLE 1

|  | Vo1 | Vo2 | CK | CNK |
|---|---|---|---|---|
| $V_{N11} > V_A$ | 1 | 1 | 1 | 0 |
| $V_A > V_{N11} > V_B$ | 0 | 1 | 0 | 1 |
| $V_{N11} < V_B$ | 0 | 0 | 0 | 0 |

Figure 8A:
FIGS. 8A to 8F are operating waveform diagrams for explaining the operation of a voltage compensating section illustrated in FIG. 6.
Figure 8B:
Figure 8C:
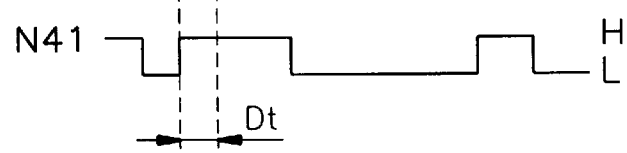
Figure 8D:
Figure 8E:
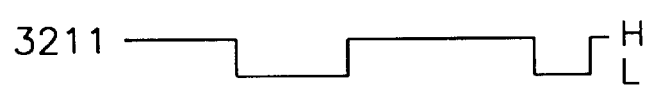

The output of voltage detecting section 310 is inputted in feedback voltage generating section 320. FIG. 6 illustrates an example of feedback voltage generating section 320 illustrated in FIG. 4. In FIG. 6, two output terminals of voltage detecting section 310 are connected with first and second input terminals CK and CNK of feedback voltage generating section 320. Feedback voltage generating section 320 includes voltage compensating section 322 for generating a voltage for controlling the tuning point voltage of tuning circuit 200, and driving section 321 for driving voltage compensating section 322 by treating signals inputted from input terminals CK and CNK. If the signal as in FIG. 8A is inputted to first input terminal CK of driving section 321 and the input of second input terminal CNK is low level, the output of a tenth node N40 is outputted in the same waveform as that in FIG. 8B at driving section 321, and the output of an eleventh node N41 is outputted as a delayed waveform which is delayed by the time of input signal Dt provided by inverters IN5–IN8, as in FIG. 8C. The signals in FIGS. 8B and 8C are two input signals of XOR gate 401, and the output of second XOR gate G3 is illustrated in FIG. 8D. An output signal 4010 of second XOR gate G3 becomes the input signal of sixth T flip-flop T6, and sixth T flip-flop T6 treats the inputted signal and outputs the driving signal as in FIG. 8E to voltage compensating section 322.

Figure 8F:
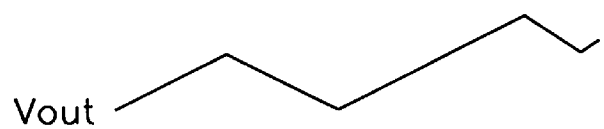

Two outputs of sixth T flip-flop T6 are complementary to each other. Accordingly, second transistor Tr42 and first transistor Tr41 of voltage compensating section 322 operate complementarily to each other. When first transistor Tr41 is turned on, third and seventh transistors Tr43 and Tr47 are turned on and sixteenth capacitor C16 is charged. The charging of sixteenth capacitor C16 continues till ninth transistor Tr49 is off. As a result, the output voltage of voltage compensating section 322 increases. On the contrary, if second transistor Tr42 is turned on, fourth, eighth, ninth and tenth transistors Tr44, Tr48, Tr49 and Tr50 of voltage compensating section 322 are turned-on and consequently, sixteenth capacitor C16 discharges the charged charges and the output voltage of voltage compensating section 322 is lowered. The waveform of the compensating voltage output of voltage compensating section 322 is illustrated in FIG. 8F. The operation of voltage compensating section 322 is conducted when the input signal of second input terminal CNK of feedback voltage generating section 320 is low. On the contrary, when the voltage of second input terminal CNK is high, the charging and discharging of capacitor C19 of voltage compensating section 322 are brought to a stop. Therefore, voltage compensating section 322 outputs a constant voltage. Since output voltage $V_{N11}$ of comparing section 312 of voltage detecting section 310 is between standard voltage $V_A$ of second comparator OP7 and standard voltage $V_B$ of third comparator OP8, the tuning frequency of tuning section 200 and the central frequency of the broadcasting frequency are in a constant range.

Figure 9:
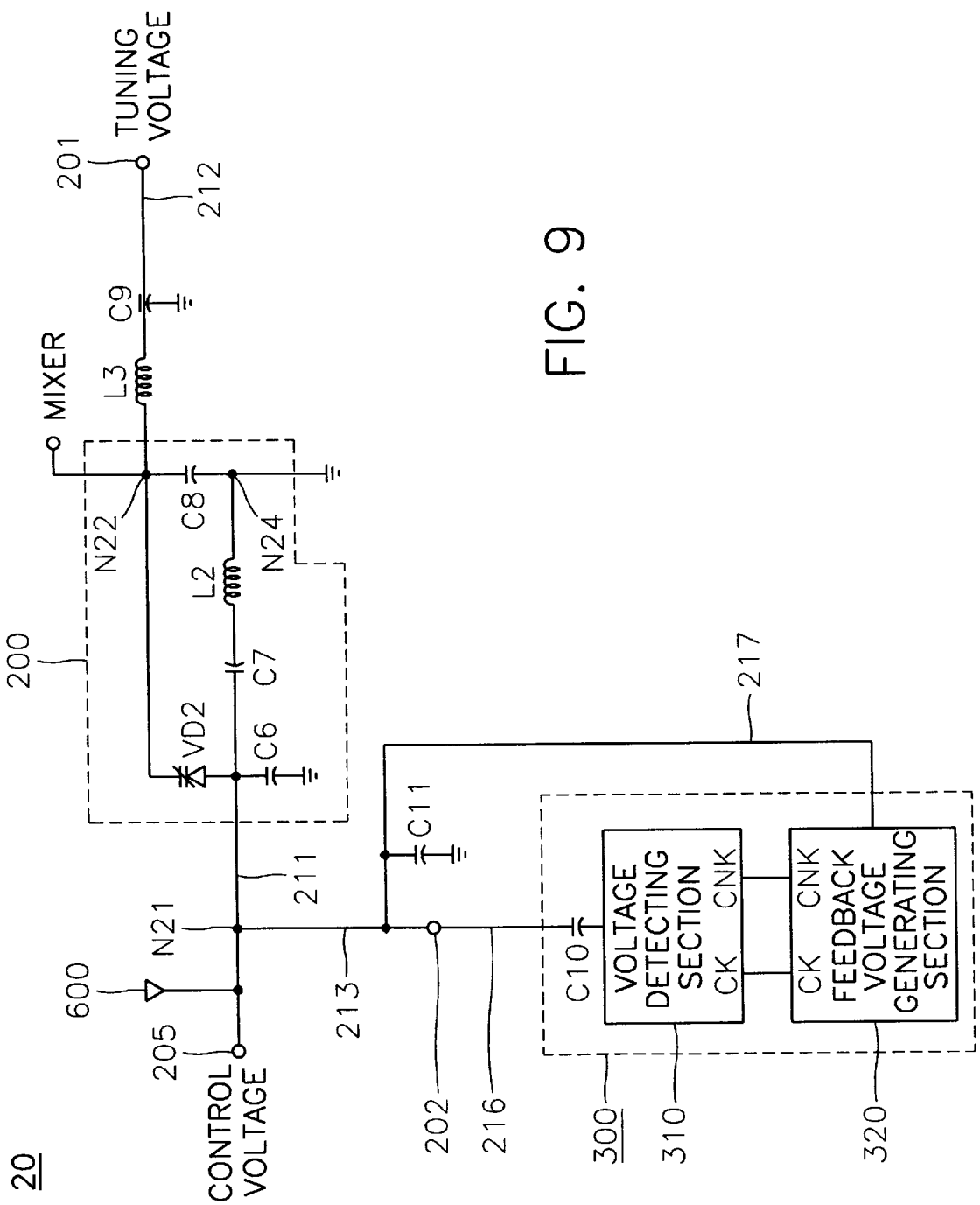
FIG. 9 illustrates a tuning circuit diagram having the function of controlling a tuning point according to a fourth embodiment of the present invention.

FIG. 9 is a tuning circuit diagram having the function of controlling a tuning point according to a fourth embodiment of the present invention.

In FIG. 9, the same reference numerals are used for the same components illustrated in FIG. 4.

The tuning circuit having the function of controlling the tuning point according to the fourth embodiment of the present invention includes tuning section 200, which outputs the broadcasting signal which is equivalent to the applied tuning voltage, includes voltage detecting section 310 for detecting the broadcasting signal from tuning section 200 and outputting the voltage detection signal, and includes feedback voltage generating section 320 for controlling the tuning point voltage applied to tuning section 200 according to the voltage detection signal from voltage detecting section 310.

Voltage detecting section 310 detects the voltage of the broadcasting signal from tuning section 200 applied via second terminal 202 for controlling the tuning point voltage. Voltage detecting section 310 is connected with tuning circuit 200 through the connection of first node N21 and second terminal 202 of tuning section 200 so as to detect the voltage of the broadcasting signal from tuning section 200.

Feedback voltage generating section 320 compensates the tuning voltage according to the level change of the voltage of the broadcasting signal detected from voltage detecting section 310. Feedback voltage generating section 320 is connected with voltage detecting section 310 via first and second input terminals CK and CNK. In addition, feedback voltage generating section 320 is connected with tuning section 200 via first node N21, second terminal 202 and seventh lead wire 217 for compensating the tuning voltage according to the level change of the voltage of the broadcasting signal detected by voltage detecting section 310.

One terminal of varactor diode VD2 of tuning section 200 is connected with antenna 600 and fifth terminal 205 via first lead wire 211 and first node N21, and is connected to one terminal of sixth capacitor C6 and a seventh capacitor C7. The other electrode of sixth capacitor C6 is earthed. The other terminal of varactor diode VD2 is connected to the mixer via second node N22 and is connected to first terminal 201 via second node N22 and third node N23. In addition, varactor diode VD2 is connected to one terminal of an eighth capacitor C8, which has one terminal connected in parallel to second node N22. The other terminal of eighth capacitor C8 is connected with an inductor L2 connected in series with the other terminal of seventh capacitor C7, and is earthed via fourth node N24.

The tuning frequency of tuning section 200 is determined by the input voltages of both terminals of varactor diode VD2. The voltage of varactor diode VD2 is determined by the tuning voltage applied from first terminal 201. Since the tuning voltage is already determined, the capacitance of varactor diode VD2 is determined by the voltage applied from third lead wire 213 connected with the other terminal of varactor diode VD2, that is, by the voltage difference of first terminal 201 and first node N21.

In FIG. 9, the operations of voltage detecting section 310 and feedback voltage generating section 320 are the same as the operations of voltage detecting section 310 and feedback voltage generating section 320 in the third embodiment of the present invention. Therefore, detailed description of the operations will be omitted.

Figure 10:
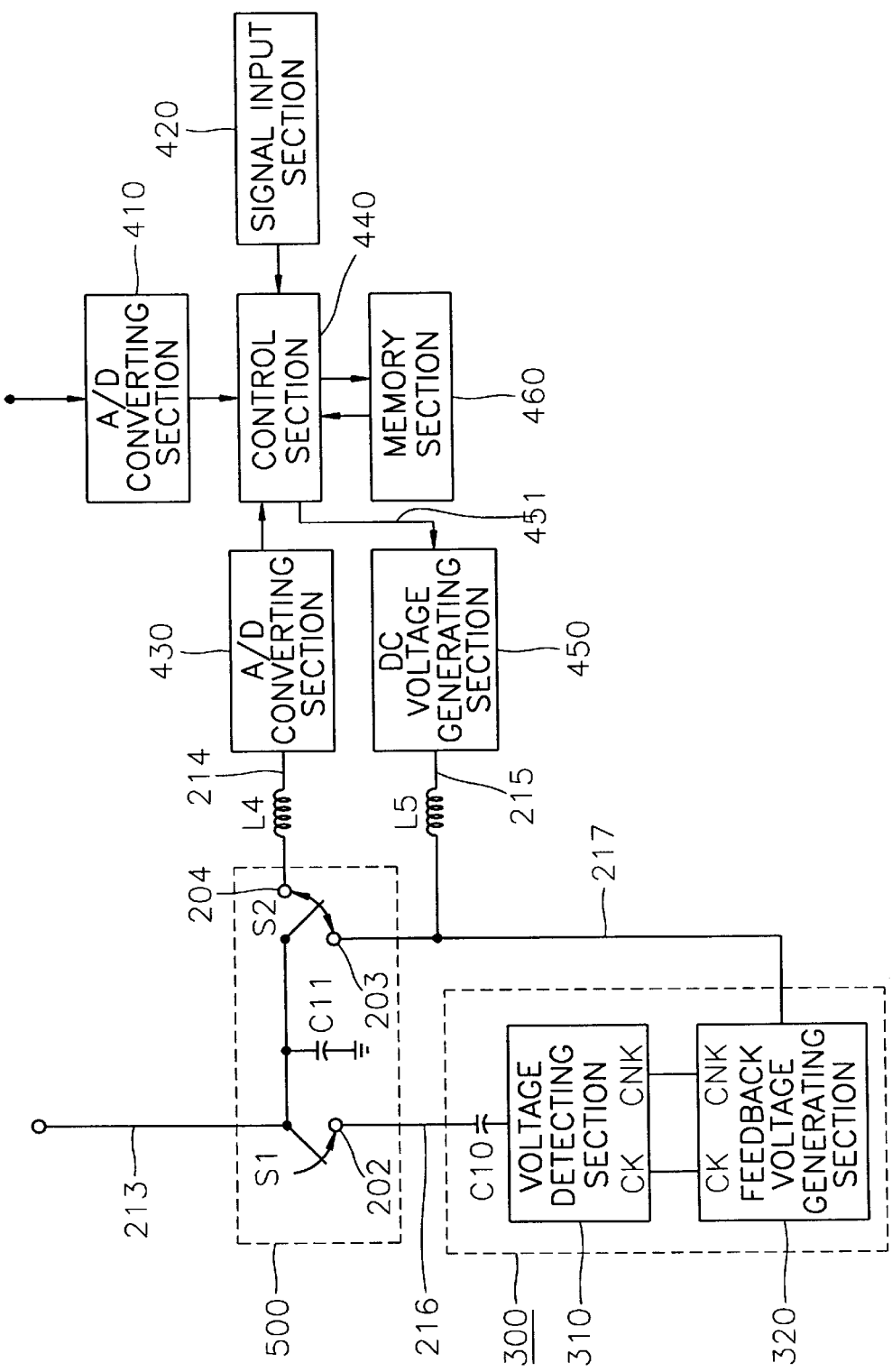
FIG. 10 illustrates the configuration of an apparatus for controlling a tuning point according to a fifth embodiment of the present invention.

FIG. 10 illustrates an apparatus for controlling a tuning point according to a fifth embodiment of the present invention.

In FIG. 10, the apparatus for controlling the tuning point includes memory section 460, direct current voltage generating section 450, signal input section 420, first analog/digital converting section 410, second analog/digital converting section 430, control section 440, voltage detecting section 310, feedback voltage generating section 320 and a switching section 500.

In FIG. 10, the same reference numerals are used for the same components illustrated in FIGS. 2 to 9.

First analog/digital converting section 410 converts the voltage applied from first terminal 201 into a predetermined digital signal and transmits this digital signal to control section 440. During the work for tuning points, a second switch S2 turns on second analog/digital converting section 430 and third lead wire 213 and turns off direct current voltage generating section 450. On the contrary, after the completion of the work for tuning points, second switch S2 turns off second analog/digital converting section 430 and direct current voltage generating section 450, which is to be connected with third lead wire 213.

Memory section 460 stores the tuning voltage data by the tuning circuit (not shown) and the tuning point voltage data by the tuning voltage data. Direct current voltage generating section 450 generates a voltage which is equivalent to control signal 451 inputted from control section 440 and provides this generated voltage to third lead wire 213 of tuning section 200 via second switch S2. Signal input section 420 provides memory instruction signal to control section 440 for storing the tuning voltage data and the tuning point voltage data in memory section 460. First analog/digital converting section 410 converts the applied tuning voltage into a predetermined digital signal and outputs this digital signal. Second analog/digital converting section 430 outputs an AC component signal inputted via second switch S2 as a predetermined digital signal. Control section 440 operates by the operation of signal input section 420 and stores the tuning voltage applied from first analog/digital converting section 410 and the tuning point control voltage applied from second analog/digital converting section 430 in memory section 460. In addition, control section 440 provides control signal 451 to voltage generating section 450 so that voltage generating section 450 provides the point voltage for the relevant selected channel based on the tuning point voltage data stored in memory section 460 during the application of the tuning voltage.

Voltage detecting section 310 detects the voltage of the broadcasting signal from tuning section 200 applied via second terminal 202 for controlling the tuning point voltage. Voltage detecting section 310 is connected with tuning circuit 200 through the connection of first switch S1 and second terminal 202 so as to detect the voltage of the broadcasting signal from tuning section 200. Feedback voltage generating section 320 compensates the tuning voltage according to the level change of the voltage of the broadcasting signal detected from voltage detecting section 310. In addition, feedback voltage generating section 320 is connected with voltage detecting section 310 via first and second input terminals CK and CNK. In addition, feedback voltage generating section 320 is connected with direct current voltage generating section 450 through the connection of second switch S2 and a third terminal 203 for compensating the tuning voltage according to the level change of the voltage of the broadcasting signal detected by voltage generating section 320.

Switching section 500 comprises first switch S1 and second switch S2. First switch S1 and second switch S2 are connected in parallel to each other to third lead wire 213. The other terminal of first switch S1 is connected to voltage detecting section 310 via second terminal 202 and a sixth lead wire 216. Between first switch S1 and second switch S2, an eleventh capacitor C11 is connected in parallel with first switch S1, and the other terminal of eleventh capacitor C11 is earthed. Eleventh capacitor C11 cuts-off the AC component from first switch S1 and prevents the flow of the AC component via second switch S2. Second switch S2 is provided with third terminal 203 and fourth terminal 204. Fourth terminal 204 is connected to the input side of second analog/digital converting section 410 via fourth lead wire 214, and fourth inductor L4 which has one of its electrodes earthed, is connected to fourth lead wire 214. Fourth inductor L4 cuts-off the AC component from second switch S2 and prevents the flow of the AC component via second analog/digital converting section 430. Third terminal 203 is connected to the output side of direct current voltage generating section 450 via a fifth lead wire 215, and is connected to the output side of feedback voltage generating section 320 via seventh lead wire 217. Fifth inductor L5, which has one of its electrodes earthed, is connected to fifth lead wire 215. Fifth inductor L5 cuts-off the AC component from second switch S2 and prevents the flow of the AC component via direct current voltage generating section 450 and feedback voltage generating section 320. The switching operations of first switch S1 and second switch S2 are carried out by a user. First switch S1 is in the state of off during the work for tuning points, which will be explained afterward, and then is in the state of on with tenth capacitor C10 after the completion of the work for tuning points by the user.

Between second terminal 202 and voltage detecting section 310, tenth capacitor C10 is installed. The other terminal of tenth capacitor C10 is connected to voltage detecting section 310, and voltage detecting section 310 is connected with feedback voltage generating section 320. Feedback voltage generating section 320 is connected to third terminal 203 via seventh lead wire 217.

In the above-mentioned constitution, the tuning voltage applied to the tuning circuit (not shown) is converted into a digital signal by first analog/digital converting section 410, and this digital signal is inputted to control section 440. The tuning point controlling voltage for controlling the tuning point of the tuning circuit (not shown) is applied to second analog/digital converting section 410 via third lead wire 213 and switch S2 and is converted into a digital signal. The tuning point control voltage converted into the digital signal is inputted to control section 440, and when the tuning circuit is tuned at the tuning point by the tuning point control voltage, the user informs control section 440 that the present tuning point control voltage is the tuning point voltage via signal input section 420. Then, control section 440 stores the tuning point control voltage signal inputted from second analog/digital converting section 430 in memory section 460 in correspondence with the tuning voltage. Through the above-mentioned process, the work for tuning points is completed by storing the tuning point voltage with respect to each tuning voltage in memory section 460.

When the storing of the tuning point voltage in memory section 460 is completed by the above-mentioned process, the user connects third lead wire 213 and second terminal 202 by operating first switch S1. When third lead wire 213 and second terminal 202 are connected, the frequency signal tuned by the tuning circuit (not shown) is provided to voltage detecting section 310. In addition, the user cuts-off the connection of third lead wire 213 and second analog/digital converting section 430 by operating second switch S2 and connects third lead wire 213 and fourth terminal 204 for outputting the generated voltage from direct current voltage generating section 450.

When switching section 500 is in the "on" state, the frequency signal of the AC component inputted via third lead wire 213 is inputted to voltage detecting section 310 via tenth capacitor C10. Voltage detecting section 310 detects the voltage of the AC component frequency signal inputted via tenth capacitor C10 and provides the detection result to feedback voltage generating section 320. Then, feedback voltage generating section 320 compensates the output voltage from direct current voltage generating section 450 according to the voltage level of the AC component signal detected from voltage detecting section 310. The operations of voltage detecting section 310 and feedback voltage generating section 320 are the same as the operations of voltage detecting section 310 and feedback voltage generating section 320 in the third embodiment of the present invention. Accordingly, a detailed description thereof will be omitted.

Figure 11:
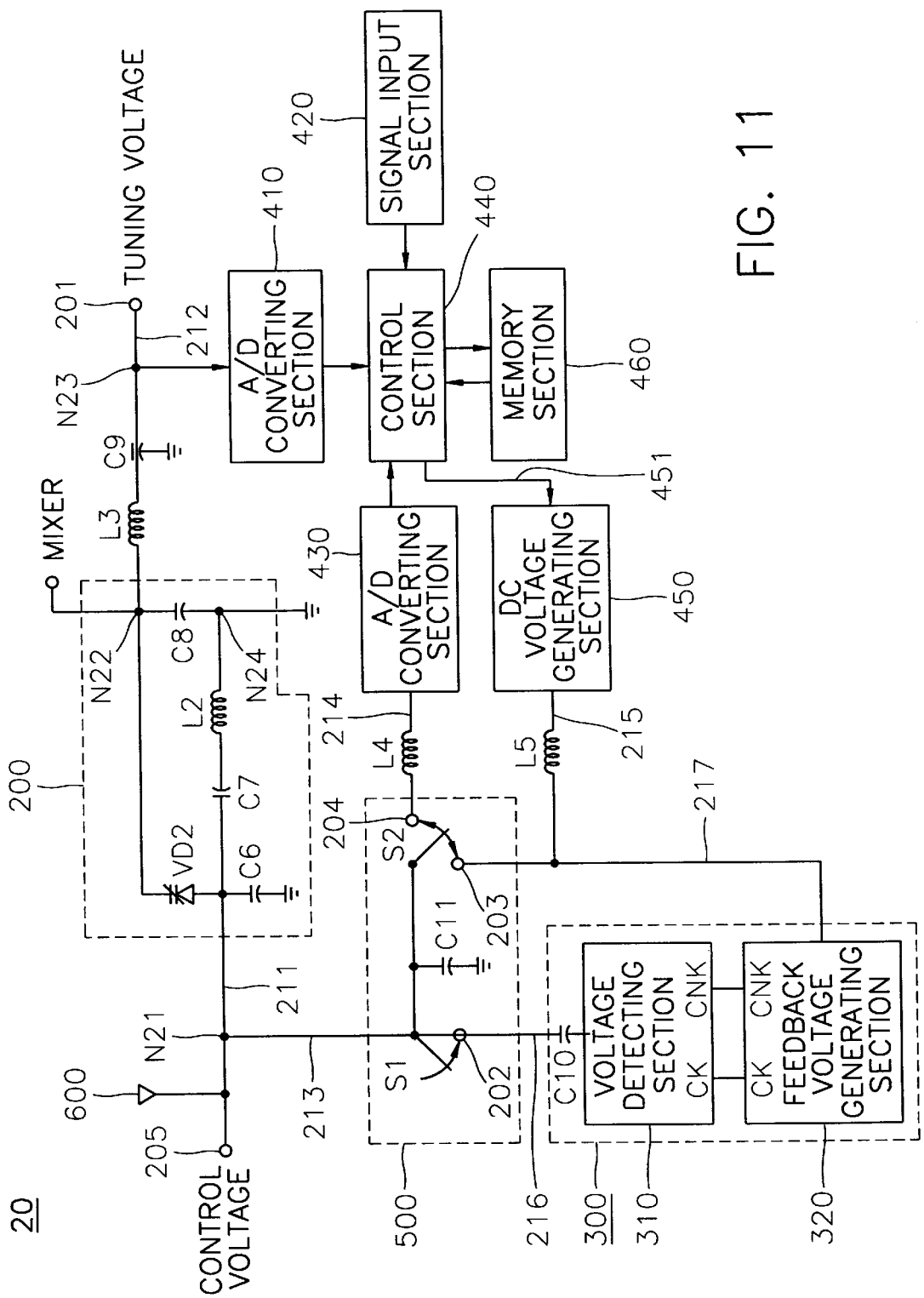
FIG. 11 illustrates a tuning circuit having the function of controlling a tuning point according to a sixth embodiment of the present invention.

FIG. 11 is a tuning circuit having the function of controlling a tuning point according to a sixth embodiment of the present invention.

In FIG. 11, the same reference numerals are used for the same components illustrated in FIGS. 2 to 10.

In FIG. 11, the tuning circuit having the function of controlling the tuning point includes memory section 460, direct current voltage generating section 450, signal input section 420, first analog/digital converting section 410, second analog/digital converting section 430, control section 440 and switching section 500.

One terminal of tuning section 200 is connected with antenna 600 and switching section 500 via first node N21 of first lead wire 211, and the control voltage is applied to tuning section 200 via fifth terminal 205 of first lead wire 211. In addition, the other terminal of tuning section 200 is connected with first analog/digital converting section 410 via third node N23 of second lead wire 212, and the tuning voltage is applied via first terminal 201 of second lead wire 212. In addition, tuning section 200 is connected to the mixer (not shown) via second node N22. To second lead wire 212, third inductor L3 is connected in parallel relation with tuning section 200, and one terminal of third inductor L3 is earthed. Third inductor L3 prevents the output of the AC component generated from tuning section 200 from being connected to first terminal 201. In FIG. 11, ninth capacitor C9 represents a parasitic capacitor included in second lead wire 212.

First analog/digital converting section 410 is connected with first terminal 201. First analog/digital converting section 410 converts the voltage of first terminal 201 into a digital signal and transmits this digital signal to control section 440. During the work for tuning points, second switch S2 connects second analog/digital converting section 430 with third lead wire 213 and disconnects it from direct current voltage generating section 450. On the contrary, after the completion of the work for tuning points, second switch S2 disconnects second analog/digital converting section 430 from direct current voltage generating section 450 and connects it with third lead wire 213.

In memory section 460, the tuning voltage data provided by tuning section 200 and the tuning point voltage data of the tuning voltage data are stored. Direct current voltage generating section 450 generates a voltage which is equivalent to control signal 451 applied from control section 440 and provides it to third lead wire 213 of tuning section 200 via second switch S2. Signal input section 420 applies the memory instruction signal to control section 440 so as to store the tuning voltage data and the tuning point voltage data in memory section 460. First analog/digital converting section 410 converts the tuning voltage applied via third node N23 into a predetermined digital signal and outputs this digital signal. Second analog/digital converting section 430 receives the voltage of the other terminal of varactor diode VD2 of tuning section 200 via fourth lead wire 214 and second switch S2 and outputs a predetermined digital signal. Control section 440 operates by the operation of signal input section 420 and stores the tuning voltage applied from first analog/digital converting section 410 and the tuning point voltages applied to second analog/digital converting section 430 in memory section 460. In addition, control section 440 provides control signal 451 to voltage generating section 450 so that voltage generating section 450 provides the point voltage for the relevant selected channel based on the tuning point voltage data stored in memory section 460 during the application of the tuning voltage.

The apparatus for controlling the tuning point of the tuning circuit according to the second embodiment of the present invention includes voltage detecting section 310 and feedback voltage generating section 320.

Voltage detecting section 310 detects the voltage of the broadcasting signal from tuning section 200 applied via second terminal 202 to control the tuning point voltage. Voltage detecting section 310 is connected to tuning circuit 200 through the connection of first switch S1 and second terminal 202 to detect the voltage of the broadcasting signal from tuning section 200. Feedback voltage generating section 320 compensates the tuning voltage according to the level change of the voltage of the broadcasting signal detected from voltage detecting section 310. In addition, feedback voltage generating section 320 is connected to voltage detecting section 310 via first and second input terminals CK and CNK. Feedback voltage generating section 320 is connected with direct current voltage generating section 450 through the connection of second switch S2 and third terminal 203 to compensate the tuning voltage according to the level change of the voltage of the broadcasting signal detected by voltage generating section 320.

Switching section 500 is connected with second analog/digital converting section 430 via fourth lead wire 214 and fourth terminal 204 and connected with direct current voltage generating section 450 via third terminal 203 and fifth lead wire 215. Switching section 500 also is connected with voltage detecting section 310 via second terminal 202 and sixth lead wire 216, and with feedback voltage generating section 320 via third terminal 203 and seventh lead wire 217.

First analog/digital converting section 410 connected with switching section 500 is connected to third node N23 of second lead wire 212, and the tuning voltage is applied to first analog/digital converting section 410.

One terminal of varactor diode VD2 of tuning section 200 is connected with antenna 600 and fifth terminal 205 via first lead wire 211 and first node N21, and also is connected to one terminal of sixth capacitor C6 and seventh capacitor C7. The other electrode of sixth capacitor C6 is earthed. The other terminal of varactor diode VD2 is connected to the mixer via second node N22 and is connected with first terminal 201 via second node N22 and third node N23. In addition, varactor diode VD2 is connected to one terminal of eighth capacitor C8 which has one terminal connected in parallel to second node N22 and the other terminal connected with inductor L2, which is connected in series with the other terminal of seventh capacitor C7, and varactor diode VD2 is earthed via fourth node N24.

The tuning frequency of tuning section 200 is determined by the input voltage of both terminals of varactor diode VD2. The voltage of varactor diode VD2 is determined by the tuning voltage applied from first terminal 201. Since the tuning voltage is already determined, the capacitance of varactor diode VD2 is determined practically by the voltage applied from third lead wire 213 connected with the other terminal of varactor diode VD2, that is, the voltage difference of first terminal 201 and third lead wire 213.

Switching section 500, which is connected to third lead wire 213, includes first switch S1 and second switch S2. First switch S1 and second switch S2 are connected to third lead wire 213 in parallel relation to each other. The other terminal of first switch S1 is connected to voltage detecting section 310 via second terminal 202 and sixth lead wire 216. Between first switch S1 and second switch S2, eleventh capacitor C11 is connected in parallel with first switch S1, and the other terminal of eleventh capacitor C11 is earthed.

Eleventh capacitor C11 cuts-off the AC component from first switch S1 and prevents the flow of the AC component via second switch S2. Second switch S2 is provided with third terminal 203 and fourth terminal 204. Fourth terminal 204 is connected to the input side of second analog/digital converting section 410 via fourth lead wire 214 and fourth inductor L4. Fourth inductor L4, which has one electrode which is earthed, is connected to fourth lead wire 214. Fourth inductor L4 cuts-off the AC component from second switch S2 and prevents the flow of the AC component via second analog/digital converting section 430. Third terminal 203 is connected to the output side of direct current voltage generating section 450 via fifth lead wire 215, and is connected to the output side of feedback voltage generating section 320 via seventh lead wire 217. To fifth lead wire 215, fifth inductor L5, which has one electrode which is earthed, is connected. Fifth inductor L5 cuts-off the AC component from second switch S2 and prevents the flow of the AC component via direct current voltage generating section 450 and feedback voltage generating section 320. The switching operations of first switch S1 and second switch S2 are carried out by the user. First switch S1 is in the "off" state so that tenth capacitor C10 is disconnected during the working for tuning points, which will be described afterwards, and then is in the "on" state after the completion of the working for tuning points.

Between second terminal 202 and voltage detecting section 310, tenth capacitor C10 is installed. The other terminal of tenth capacitor C10 is connected to voltage detecting section 310, and voltage detecting section 310 is connected with feedback voltage generating section 320. Feedback voltage generating section 320 is connected to third terminal 203 via seventh lead wire 217.

Voltage detecting section 310 detects the voltage of the tuned signal by tuning section 200 via tenth capacitor C10 and first switch S1, treats the detected signal and outputs the result to first and second input terminals CK and CNK of feedback voltage generating section 320, as illustrated in FIG. 5.

Voltage detecting section 310 includes input section 311 for successively sampling the broadcasting signals received by tuning section 200 and for outputting the sampled signals, comparing section 312 for comparing the successive signals sampled from input section 311 and outputting the compared data, signal generation section 313 for providing first control signal 3131 to input section 311 in order to determine the sampling time by input section 311, and for providing second and third control signals 3132 and 3133 to comparing section 312 in order to compare and determine the respective output times of comparing section 312, and discriminating section 314 for discriminating the compared data 3120 from comparing section 312 and for outputting the discriminated signal.

Input section 311 includes amplifier OP1 for amplifying the inputted signal from tuning section 200 and outputting amplified signal 3111, first transmitting transistor Tr11 connected to the output terminal of amplifier OP1 and selectively being turned-on according to the signal level of signal generation section 313 inputted to the gate of amplifier OP1 to output amplified signal 3111 from amplifier OP1, and second transmitting transistor Tr12 connected to the output terminal of amplifier OP1 for outputting amplified signal 3111 from amplifier OP1 via complementary operation with first transmitting transistor Tr11 during a turned-on state thereof. The output terminal of first transmitting transistor Tr11 is connected with first unity-gain buffer OP2, and the output terminal of second transmitting transistor Tr12 is connected with second unity-gain buffer OP3. The output terminal of first unity-gain buffer OP2 is connected to the input terminal of comparing section 312 via third resistor R3. The output terminal of second unity-gain buffer OP3 is connected to the other input terminal of comparing section 312 via fourth resistor R4. At amplifier OP1, first resistor R1 and second resistor R2 are connected in parallel with the inversion terminal of amplifier OP1, for amplifying broadcasting signal 2040 inputted via second terminal 204 by a constant ratio. The gate electrodes of first and second transmitting transistor Tr11 and Tr12 are connected to first output node N31, which is the common node of the output terminal of signal generation section 313, and first inverter IV1 is provided between the gate electrode of second transistor Tr12 and first output node N31 for the complementary operation of first and second transistors Tr11 and Tr12.

Amplifier OP1 of input section 311 non-inversely amplifies broadcasting signal 2040 inputted via input terminal 204 by the ratio of R2/R1, and outputs non-inversely amplified broadcasting signal 3110 which has been amplified by the ratio of R2/R1 to first and second transmitting transistor Tr11 and Tr12. First and second transmitting transistors Tr11 and Tr12 receive non-reversely amplified broadcasting signal 3111, which has been amplified by amplifier OP1 by the ratio of R2/R1 and output the amplified broadcasting signal according to respective gate input signals 3100 and 3101. Gate signal 3100 of first transmitting transistor Tr11 is a signal obtained by twice inverting output signal 3131 of fifth T flip-flop of signal generation section 313 via second and third inverters IV2 and IV3, which are connected in series. Gate signal 3101 of second transmitting transistor Tr12 is a signal obtained by inverting again gate signal 3100 of first transmitting transistor Tr11. Therefore, first transmitting transistor Tr11 and second transmitting transistor Tr12 operate complementarily, and as a result, the signals continuously outputted from amplifier OP1 are successively sampled by the complementarity of first transistor Tr11 and second transistor Tr12.

Comparing section 312 is connected to first and second diodes D1 and D2 in parallel, which are respectively connected in series to the third resistor and the fourth resistor for rectifying the successively sampled signals by input section 311, and includes first and second rectifying circuits 3121 and 3122 consisting of fifteenth and sixteenth capacitors C15 and C16, each of which has one terminal which is earthed. First and second bypass transistors Tr21 and Tr22 are connected to first and second diodes D1 and D2 in parallel relation with fifteenth and sixteenth capacitors C15 and C16 of first and second rectifying circuits 3121 and 3122. To the gate electrodes of first and second bypass transistors Tr21 and Tr22, second output signal 3132 of signal generation section 313 is inputted, and the source electrodes of first and second bypass transistors Tr21 and Tr22 are earthed for discharging the charged charges of fifteenth and sixteenth capacitors C15 and C16 of first and second rectifying circuits 3121 and 3122 according to the voltage level of second output signal 3132. First comparator OP4 for comparing the first charging voltage and the second charging voltage of twelfth capacitor C12 and thirteenth capacitor C13, and for outputting the compared result, is connected to the drain electrode portion of first and second bypass transistors Tr21 and Tr22.

In addition, to the output terminal of first comparator OP4, third transmitting transistor Tr13 is connected, and third transmitting transistor Tr13 is selectively turned-on according to the level of the third output signal of signal generation section 313 and outputs the compared result from first comparator OP4. To the output terminal of third transmitting transistor Tr13, third and fourth unity-gain buffers OP5 and OP6 are successively connected. Between third transmitting transistor Tr13 and third unity-gain buffer OP5, fourteenth capacitor C14 is connected in parallel with third unity-gain buffer OP5, and one terminal of fourteenth capacitor C14 is earthed. In addition, between third and fourth unity-gain buffers OP5 and OP6, fifth resistor R5 is provided. Fifteenth capacitor C15 is connected in parallel with fourth unity-gain buffer OP6, and with fifth resistor R5, and one terminal of fifteenth capacitor C15 is earthed.

Half-wave rectified broadcasting signal is inputted to first comparator OP4, and the compared result is transmitted to third and fourth unity-gain buffers OP5 and OP6 via third transmitting transistor Tr13 and amplified. The gates of first bypass transistor Tr21 and second bypass transistor Tr22 are commonly connected to second output node N32, and the charging voltage of fifteenth and sixteenth capacitors C15 and C16 are discharged according to the voltage level of second output node N32. Third transmitting transistor Tr13 outputs the result of first comparator OP4 according to the voltage level of third output node N33.

Signal generation section 313 includes voltage control oscillator 3134 for generating a signal having a predetermined frequency, and frequency demultiplier 3135 for demultiplying the frequency of the generated signal from voltage control oscillator 3134 in order to generate the first, the second and the third control signals. Frequency demultiplier 3135 has first, second, third, fourth and fifth T flip-flops T1, T2, T3, T4 and T5, whose input terminals and output terminals are dependently connected.

Ninth node N39 of fifth T flip-flop T5 is connected to first output terminal 3131 via second and third inverters IV2 and IV3, and first output terminal 3131 is connected with first output node N31. Sixth to ninth nodes N36 to N39 of second to fifth T flip-flops T2, T3, T4 and T5 are connected to four input terminals of NOR gate G1. In addition, sixth to ninth nodes N35 to N38 of second to fifth T flip-flops T2, T3, T4 and T5 and fifth node N35 of first T flip-flop T1 are connected to five input terminals of NAND gate G2. Second output terminal 3132 of NOR gate G1 is connected with second output node N9, and third output terminal 3133 of NAND gate G2 is connected with third output node N33.

Discriminating section 314 includes second comparator OP7 and third comparator OP8. Second comparator OP7 compares the voltage which is equivalent to the compared result from comparator 312 with first standard voltage $V_A$, outputs first compared signal 3141, which is equivalent to the compared result, to one input terminal 3143 of XOR gate G3 and outputs first discrimination signal 3143 to first input terminal CK of feedback voltage generating section 320 via buffer 3145 consisting of fourth and fifth inverters IV4 and IV5.

Third comparator OP8 compares the voltage which is equivalent to the compared result from comparing section 312 with second standard voltage $V_B$ and outputs third compared signal 3142, which is equivalent to the compared result, to another input terminal 3144 of XOR gate G3. First XOR gate G3 logically operates the second compared signal from second comparator OP7 with the third compared signal from third comparator OP8 and outputs outputted second discrimination signal 3144 to second input terminal CNK.

Feedback voltage generating section 320 includes driving section 321 and voltage compensating section 322, as illustrated in FIG. 6. Driving section 321 is connected with first input terminal CK and is provided with sixth inverter IV6, which inverts first discrimination signal inputted from first input terminal CK. In addition, first input terminal CK is connected with seventh inverter IV7 of driving section 321, and seventh inverter IV7 is continuously connected in series with eighth, ninth and tenth inverters IV8, IV9 and IV10 so as to delay first discrimination signal inputted from first input terminal CK. Two output signals of sixth inverter IV6 and tenth inverter IV10 are inputted to second XOR gate G4, and the output of first XOR gate G3 is inputted to sixth T flip-flop T6. One output terminal of sixth T flip-flop T6 is connected to third input terminal 3211 and the other terminal is connected with fourth input terminal 3212.

Third input terminal 3211 of driving section 321 is connected with the gate electrode of first transistor Tr41 of voltage compensating section 322, and fourth input terminal 3212 is connected with the gate electrode of second transistor Tr42. The drain electrode of first transistor Tr41 is connected with the source and the gate electrodes of third transistor Tr43, which complementarily operates with first transistor Tr42. The drain electrode of second transistor Tr42 is connected with the source and the gate electrodes of fourth transistor Tr44, which complementarily operates with second transistor Tr42.

In addition, the source electrode of first transistor Tr41 is connected with the drain electrode of fifth transistor Tr45, which complementarily operates with first transistor Tr41. The source electrode of second transistor Tr42 is connected with the drain electrode of sixth transistor Tr46. The source electrode of fifth transistor Tr45 and the source electrode of sixth transistor Tr46 are earthed, and the gate electrode of fifth transistor Tr45 and the gate electrode of sixth transistor Tr46 are connected with second input terminal CNK.

The gate electrode of third transistor Tr43 is connected with the gate electrode of seventh transistor Tr47, which complementarily operates with first transistor Tr41, and the gate electrode of fourth transistor Tr44 is connected with the gate electrode of eighth transistor Tr48, which complementarily operates with second transistor Tr42.

The source electrode of seventh transistor Tr47 is connected with the drain electrode of ninth transistor Tr49, which complementarily operates with seventh transistor Tr47, and the source electrode of eighth transistor Tr48 is connected with the drain and the gate electrodes of tenth transistor Tr50, which complementarily operates with eighth transistor Tr48.

The gate electrode of ninth transistor Tr49 is connected with the gate electrode of tenth transistor Tr50, with the contact of the drain electrode of tenth transistor Tr50, and with the source of eighth transistor Tr48. The source electrode of ninth transistor Tr49 and the source electrode of tenth transistor Tr10 are earthed.

Further, the drains of third, fourth, seventh and eighth transistors Tr43, Tr44, Tr47 and Tr48 are connected with external electrode $V^+$ via sixth, seventh, eighth and ninth resistors R6, R7, R8 and R9, respectively. In addition, between the contact of the drain of ninth transistor Tr49 and seventh transistor Tr47 and the earth, sixteenth capacitor C16 for charging is connected. The contact of the drain of ninth transistor Tr49 and seventh transistor Tr47 is connected with feedback voltage output terminal $C_{OUT}$ of sixteenth capacitor C16, and the charging voltage is externally outputted via seventh lead wire 217, which is connected with feedback voltage output terminal $C_{OUT}$.

In FIG. 11, the work for controlling the tuning point of the tuner is carried out as follows. First, the user inputs the tuner voltage for tuning the channels to first terminal 201 and confirms whether or not the selected channel signal according to the tuner voltage for tuning the channel coincides with the tuning frequency of tuning section 200 by an instrumentation machine (not shown), e.g. oscilloscope (not shown) installed on fifth terminal 205. If tuning circuit 200 is not exactly at the tuning point, the voltage of varactor diode VD2 is adjusted by applying the compensating voltage via fifth terminal. At this time, when tuning section 200 accurately receives the relevant broadcasting channel signal, tuning section 200 transmits the accurate adjustment to the tuning point to control section 440 via signal input section 420. Then, control section 440 reads the tuning voltage and the tuning point voltage from first analog/digital converting section 410 and second analog/digital converting section 430 and stores the relevant channel voltage and the tuning point voltage in memory section 460. In the same manner, the work for tuning points is completed via the work for tuning points to respective channel voltage during the manufacturing of the tuner.

After the completion of the work for tuning points, the user operates first switch S1 to connect third lead wire 213 to second terminal 202. When the connection of third lead wire 213 with second terminal 202 is completed, the broadcasting signal received by tuning section 200 is provided to voltage detecting section 310. In addition, the user operates second switch S2, cuts-off the connection of third lead wire 213 with second analog/digital converting section 430 and connects third lead wire 213 with fourth terminal 204 so that the a voltage generated from direct current voltage generating section 450 could be applied to varactor diode VD2.

Thereafter, the operation of the tuning circuit will be explained with reference to FIGS. 5 to 8. When the tuning voltage is applied to tuning section 200 for tuning the channel, the tuning voltage is applied to varactor diode VD2 and is provided to first analog/digital converting section 410. When the tuning voltage is applied to first analog/digital converting section 410, first analog/digital converting section 410 outputs the a signal which is equivalent to the tuning voltage. When the tuning voltage is applied to control section 440, control section 440 reads the data which are equivalent to the tuning voltage from memory section 460, controls direct current voltage generating section 450 based on the read data and outputs the tuning point voltage via lead wire 203. When the tuning point voltage is generated from direct current voltage generating section 450, the difference voltage of the tuning voltage and the tuning point voltage is applied to varactor diode VD2 of tuning section 200, and this difference voltage enables the receipt of the exactly selected broadcasting signal by means of tuning section 200.

The values of the parts of tuning section 200 varies according to the environmental temperature and to the central frequency changes by DRIFT of the broadcasting signal inputted from antenna 600. The broadcasting signal received by tuning section 200 is inputted to voltage detecting section 310 via fourth lead wire 214 and is treated. The broadcasting signal inputted to voltage detecting section 310 is a continuous signal. Voltage detecting section 310 compares the continuously inputted before and after signal of the broadcasting signal and outputs the result. When the compared result from voltage detecting section 310 is inputted, feedback voltage generating section 320 outputs a predetermined voltage based on the compared result and controls the voltage of lead wire 215. Accordingly, the output voltage of direct current voltage generating section 450 lies under the control of feedback voltage generating section 320, and as a result, the tuning frequency of tuning section 200 is continuously controlled.

The operation of the tuning circuit having the function of controlling the tuning point voltage according to the sixth embodiment of the present invention will be explained, while referring to the attached FIGS. 7A to 8F.

FIGS. 7A to 8I are waveform diagrams for explaining the operation of voltage detecting section 310, illustrated in FIG. 5. The output waveforms of output terminal nodes N35–N39 of first to fifth flip-flops T1–T5 are quantitatively illustrated in FIGS. 5A to 5E. Signal generation section 313 externally outputs signals via first output node N31, second output node N32 and third output node N33. The output waveforms of first output node N31, second output node N32 and third output node N33 are illustrated in FIGS. 7G to 7I. In FIGS. 7G to 7I, the output having a high level for the longest time is the output of third output node N33, and the output having a high level for the next longest time is first output node N31. This time relation will be described in detail hereafter.

Discriminating section 314 includes second and third comparators OP7 and OP8 having first standard voltage $V_A$ and second standard voltage $V_B$ so as to discriminate the inputted signal from comparing section 312, and includes XOR gate G3 for the logical operation of first and second compared results 3141 and 3142 of second and third comparators OP7 and OP8.

In FIG. 5, first transmitting transistor Tr11 of input section 311 is turned-on when first output node N31 of signal generation section 313 is high and transmits the broadcasting signal outputted to first amplifier OP1 to first unity-gain buffer OP2, as illustrated in FIG. 5E. At this time, since second transmitting transistor Tr12 is in the turned-off state, the transmission of broadcasting signal 3111 to second unity-gain buffer OP3 is cut-off. When the voltage of first output node N31 is low level, first transmitting transistor Tr11 is off while second transmitting transistor Tr12 is on. Also, the next broadcasting signal is transmitted only to second unity-gain buffer OP3. Therefore, input section 311 successively samples the continuously inputted broadcasting signals by ½ period of the waveform in FIG. 5F.

First and second signals 3113 and 3114 transmitted from first unity-gain buffer OP2 and second unity-gain buffer OP3 of input section 311 are half-wave rectified by first and second diodes D1 and D2, and rectified first and second signals 3115 and 3116 charge again fifteenth and sixteenth capacitors C15 and C16. During the charging of fifteenth and sixteenth capacitors C15 and C16, third and fourth bypass transistors Tr21 and Tr22 are turned-on, as illustrated in FIG. 5H. Therefore, fifteenth and sixteenth capacitors C15 and C16 discharge all the charges before the charging. The charging voltages of fifteenth and sixteenth capacitors C15 and C16 are applied to first comparator OP4 and compared to each other, and the compared result is outputted to third unity-gain buffer OP5 via third transmitting transistor Tr13. Third transmitting transistor Tr13 is controlled by the voltage of third output node N33 of signal generation section 313, and the output waveform of third output node N33 is illustrated in FIG. 7I. Accordingly, third transmitting transistor Tr13 is turned off as soon as first and second bypass transistors Tr21 and Tr22 are turned-off. Also, during the discharging of fifteenth and sixteenth capacitors C15 and C16, the output of the result of the logical operation of first comparator OP4 is prevented.

Meanwhile, when compared result 3120 of comparing section 312 is inputted to discriminating section 314, and when standard voltage $V_A$ of second comparator OP7 is larger than standard voltage $V_B$ of third comparator OP8

($V_A > V_B$) by a predetermined value, the output of discriminating section 314 with respect to output voltage $V_{N11}$ of comparing section 312 is illustrated in the above Table 1.

The output of voltage detecting section 310 is applied to feedback voltage generating section 320. Feedback voltage generating section 320 is illustrated in FIG. 6. In FIG. 6, two output terminals of voltage detecting section 310 are connected with first and second input terminals CK and CNK of feedback voltage generating section 320. Feedback voltage generating section 320 includes voltage compensating section 322 for generating a voltage for controlling the tuning point voltage of tuning circuit 200, and driving section 321 for treating the inputted signal from input terminals CK and CNK and driving voltage compensating section 322. If the signal illustrated in FIG. 8A is inputted to first input terminal CK of driving section 321 and the input of second input terminal CNK is at a low level, the output of tenth node N40 at driving section 321 is outputted as the waveform in FIG. 8B, and the output of eleventh node N41 is outputted as the delayed waveform delayed by the input delaying time Dt by inverters IV5–IV8 as in FIG. 8C. The signals in FIGS. 8B and 8C are two input signals of XOR gate 401, and the output of second XOR gate G3 is illustrated in FIG. 6D. Output signal 4010 of second XOR gate G3 becomes the input signal of sixth T flip-flop T6, and sixth T flip-flop T6 treats the inputted signal and outputs the driving signal as in FIG. 8E to voltage compensating section 322.

Two outputs of sixth T flip-flop T6 are complementary to each other. Accordingly, second transistor Tr42 and first transistor Tr41 of voltage compensating section 322 operate complementarily to each other. When first transistor Tr41 is on, third and seventh transistors Tr43 and Tr47 are on and sixteenth capacitor C16 is charged. The charging of sixteenth capacitor C16 continues till ninth transistor Tr49 is off. As a result, the output voltage of voltage compensating section 322 increases. On the contrary, when second transistor Tr42 is turned on, fourth, eighth, ninth and tenth transistors Tr44, Tr48, Tr49 and Tr50 of voltage compensating section 322 are turned-on. As the result, sixteenth capacitor C16 discharges the charged charges and the output voltage of voltage compensating section 322 is lowered. The waveform to the compensating voltage output of voltage compensating section 322 is illustrated in FIG. 6F. The operation of voltage compensating section 322 is carried out when the input signal of second input terminal CNK of feedback voltage generating section 320 is low. On the contrary, when the voltage of second input terminal CNK is high, capacitor C19 of voltage compensating section 322 stops the charging and the discharging and voltage compensating section 322 outputs a constant voltage. Since output voltage $V_{N11}$ of comparing section 312 of voltage detecting section 310 is between standard voltage $V_A$ of second comparator OP7 and standard voltage $V_B$ of third comparator OP8, the tuning frequency of tuning section 200 and the central frequency of the broadcasting frequency are in a constant range.

As described above, the work for controlling the tuning point of the tuner is carried out as follows in the present invention. First, the user inputs the tuner voltages for tuning the channels in tuning section 200 and confirms whether or not the selected channel signal according to the tuning voltage for tuning the channel coincides with the tuning frequency of tuning section 200 by an instrumentation machine (not shown). If, tuning circuit 200 is not accurately at the tuning point, the compensating voltage is applied to control the voltage of varactor diode VD2. At this time, if tuning section 200 exactly receives the relevant broadcasting channel signal, the accurate adjustment to the tuning point is transmitted to control section 440. Then, control section 440 respectively stores the tuning voltage and the tuning point voltage from tuning section 200 in memory section 460. In the same manner, the work for tuning points to each channel voltage is carried out during the manufacturing of the tuner. After the completion of the work for tuning points, if the tuning voltage is applied to tuning section 200 for tuning the tuning operation channel of the tuner, the broadcasting signal received by tuning section 200 is provided to voltage detecting section 310. Accordingly, feedback voltage generating section 320 compares continuously inputted before and after signals and provides the predetermined voltage for compensation to tuning section 200 to continuously control the tuning frequency of tuning section 200.

As described above, the tuner according to the present invention can adjust the tuning point of the tuning circuit without adjusting the inductance of the inductor of the tuning circuit during the work for tuning points. Therefore, the amount of the working for manufacturing the tuner can be reduced. Moreover, since the tuning point of the tuning circuit is stable to the temperature, a good tuner having high performance can be obtained.

Although the preferred embodiment of the invention has been described, it is understood that the present invention should not be limited to the preferred embodiment, but various changes and modifications can be made by one skilled in the art within the spirit and scope of the invention as hereinafter claimed.

What is claimed is:

1. An apparatus for controlling a tuning point comprising:
    a means for detecting a voltage of a broadcasting signal from a tuning section for outputting said broadcasting signal which is equivalent to an applied tuning voltage, and for outputting a voltage detection signal, said means for detecting a voltage comprising:
        a sampling means for successively sampling received broadcasting signals by said tuning section and for outputting said sampled signals;
        a comparing means for comparing voltage levels of successive signals sampled from said sampling means and for outputting data which are equivalent to said compared result;
        a means for generating a signal for providing a first control signal for determining a sampling time by said sampling means to said sampling means, and for providing second and third control signals for respectively determining a time for comparing and a time for outputting of said comparing means to said comparing means; and
        a discriminating means for discriminating compared result data from said comparing means and for outputting said discriminated signal; and
    a means for generating a feedback voltage for controlling a tuning point voltage applied to said tuning section according to said voltage detection signal from said means for detecting a voltage.

2. An apparatus for controlling a tuning point as claimed in claim 1, wherein said sampling means comprises:
    an amplifier for amplifying an inputted signal and for outputting said amplified signal;
    a first transmitting transistor for outputting said amplified signal from said amplifier, said signal level being inputted to a gate of said amplifier, said first transmitting transistor being connected to said amplifier and being selectively turned-on according to a signal level of said means for generating a signal; and a second transmitting transistor for outputting said amplified signal from said amplifier, said second transmitting transistor being connected to said amplifier and being turned-on through a complementary operation with said first transmitting transistor.

3. An apparatus for controlling a tuning point as claimed in claim 1, wherein said comparing means comprises:

a rectifying circuit having first and second diodes and first and second capacitors, for rectifying said successively sampled signals provided by said sampling means;

first and second bypass transistors for respectively discharging charged charges of said first and second capacitors of said rectifying circuit according to a voltage level of a second output signal of said means for generating a signal, said voltage level being inputted to gates of said first and second capacitors, said first and second bypass transistors being respectively connected in parallel with said first and said second capacitors of said rectifying circuit;

a first comparator for comparing a first charging voltage and a second charging voltage of said first capacitor and said second capacitor, and for outputting said compared result; and a third transmitting transistor for outputting said compared result from said first comparator, said third transmitting transistor being selectively turned-on according to a level of a third output signal of said means for generating a signal.

4. An apparatus for controlling a tuning point as claimed in claim 1, wherein said means for generating a signal comprises:

an oscillator for generating a signal having a predetermined frequency; and a frequency multiplier for multiplying said generated signal from said oscillator for generating said first control signal, said second control signal and said third control signal.

5. An apparatus for controlling a tuning point as claimed in claim 4, wherein said frequency multiplier includes at least one T flip-flop whose input terminal and output terminal are dependently connected.

6. An apparatus for controlling a tuning point as claimed in claim 1, wherein said discriminating means comprises:

a second comparator for comparing a voltage which is equivalent to said compared result from said comparing means with a first standard voltage and outputting a first discrimination signal which is equivalent to said compared result;

a third comparator for comparing a voltage which is equivalent to said compared result from said comparing means with a second standard voltage and outputting a logic signal which is equivalent to said compared result; and an exclusive gate for outputting the first discrimination signal outputted from said second comparator and for outputting a second discrimination signal by a logical operation of the first discrimination signal and the third comparison signal from said third comparator.

7. An apparatus for controlling a tuning point as claimed in claim 1, wherein said means for generating a feedback voltage comprises:

a means for compensating a voltage for generating a compensating voltage for controlling said tuning point voltage of said tuning section; and a driving means for driving said means for compensating a voltage based on a voltage detection signal inputted from said means for detecting a voltage.

8. A tuning circuit for controlling a tuning point comprising:

a tuning section for outputting a broadcasting signal which is equivalent to an applied tuning voltage;

a means for detecting a voltage for detecting a voltage of said broadcasting signal from said tuning section and outputting a voltage detection signal, comprising:

a sampling means for successively sampling received broadcasting signals provided by said tuning section and for outputting said sampled signals;

a comparing means for comparing voltage levels of successive signals sampled from said sampling means and for outputting data which are equivalent to said compared result;

a means for generating a signal for providing a first control signal for determining a sampling time by said sampling means to said sampling means, and for providing second and third control signals for respectively determining a time for comparing and a time for outputting of said comparing means to said comparing means; and a discriminating means for discriminating compared result data from said comparing means and for outputting said discriminated signal; and a means for generating a feedback voltage for controlling a tuning point voltage applied to said tuning section according to said voltage detection signal from said means for detecting a voltage.

9. A tuning circuit having a function for controlling a tuning point as claimed in claim 8, wherein said sampling means comprises:

an amplifier for amplifying an inputted signal and for outputting said amplified signal;

a first transmitting transistor for outputting said amplified signal from said amplifier, said signal level being inputted to a gate of said amplifier, said first transmitting transistor being connected to said amplifier and being selectively turned-on according to a signal level of said means for generating a signal; and a second transmitting transistor for outputting said amplified signal from said amplifier, said second transmitting transistor being connected to said amplifier and being turned-on through a complementary operation with said first transmitting transistor.

10. A tuning circuit having a function for controlling a tuning point as claimed in claim 8, wherein said comparing means comprises:

a rectifying circuit having first and second diodes and first and second capacitors for rectifying said successively sampled signals provided by said sampling means;

first and second bypass transistors for respectively discharging charged charges of said first and second capacitors of said rectifying circuit according to a voltage level of a second output signal of said means for generating a signal, said voltage level being inputted to gates of said first and second capacitors, said first and second bypass transistors being respectively connected in parallel with said first and said second capacitors of said rectifying circuit;

a first comparator for comparing a first charging voltage and a second charging voltage of said first capacitor and said second capacitor, and for outputting said compared result; and a third transmitting transistor for outputting said compared result from said first comparator, said third transmitting transistor being selectively turned-on according to a level of a third output signal of said means for generating a signal.

11. A tuning circuit having a function for controlling a tuning point as claimed in claim 8, wherein said signal generating means comprises:

an oscillator for generating a signal having a predetermined frequency; and a frequency multiplier for multiplying said generated signal from said oscillator to generate said first control signal, said second control signal and said third control signal.

12. A tuning circuit having a function for controlling a tuning point as claimed in claim 11, wherein said frequency multiplier includes at least one T flip-flop whose input terminal and output terminal are dependently connected.

13. A tuning circuit having a function for controlling a tuning point as claimed in claim 8, wherein said discriminating means comprises:

a second comparator for comparing a voltage which is equivalent to said compared result from said comparing means with a first standard voltage and outputting a first discrimination signal which is equivalent to said compared result;

a third comparator for comparing a voltage which is equivalent to said compared result from said comparing means with a second standard voltage and outputting a logic signal which is equivalent to said compared result; and an exclusive gate for outputting the first discrimination signal outputted from said second comparator and for outputting a second discrimination signal by a logical operation of the first discrimination signal and the third comparison signal from said third comparator.

14. A tuning circuit having a function for controlling a tuning point as claimed in claim 8, wherein said feedback voltage generating means comprises:

a means for compensating a voltage for generating a compensating voltage for controlling said tuning point voltage of said tuning section; and a driving means for driving said means for compensating a voltage based on a voltage detection signal inputted from said means for detecting a voltage.

* * * * *